US007442485B2

(12) United States Patent
Oshima et al.

(10) Patent No.: US 7,442,485 B2
(45) Date of Patent: Oct. 28, 2008

(54) LITHOGRAPHIC PROCESS INVOLVING ON PRESS DEVELOPMENT

(75) Inventors: Yasuhito Oshima, Shizuoka (JP); Toshifumi Inno, Shizuoka (JP); Tomoyoshi Mitsumoto, Shizuoka (JP); Kazuhiro Fujimaki, Shizuoka (JP); Kazuto Shimada, Shizuoka (JP); Naonori Makino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 393 days.

(21) Appl. No.: 10/858,374

(22) Filed: Jun. 2, 2004

(65) Prior Publication Data

US 2005/0016402 A1 Jan. 27, 2005

(30) Foreign Application Priority Data

| | | | |
|---|---|---|---|
| Jun. 2, 2003 | (JP) | ............................. | 2003-157024 |
| Jul. 14, 2003 | (JP) | ............................. | 2003-274324 |
| Aug. 25, 2003 | (JP) | ............................. | 2003-300336 |
| Aug. 25, 2003 | (JP) | ............................. | 2003-300337 |

(51) Int. Cl.
*G03F 7/004* (2006.01)
*G03F 7/029* (2006.01)

(52) U.S. Cl. ................. 430/138; 430/270.1; 430/281.1; 430/302; 101/467

(58) Field of Classification Search ................. 430/302, 430/270.1, 281.1, 138, 326, 330; 101/465, 101/466, 467
See application file for complete search history.

(56) References Cited

U.S. PATENT DOCUMENTS

| | | | | |
|---|---|---|---|---|
| 6,171,748 | B1 * | 1/2001 | Tanaka et al. ............... | 430/138 |
| 6,576,401 | B2 * | 6/2003 | Teng .......................... | 430/303 |
| 7,090,957 | B2 * | 8/2006 | Shimada et al. ............. | 430/163 |
| 2003/0022095 | A1 * | 1/2003 | Kai et al. .................... | 430/170 |

* cited by examiner

*Primary Examiner*—John S Chu
(74) *Attorney, Agent, or Firm*—Sughrue Mion, PLLC

(57) ABSTRACT

A lithographic printing process comprises the steps of: imagewise exposing to infrared light a presensitized lithographic plate which comprises a hydrophilic support and an image-forming layer containing an infrared absorbing agent, a polymerization initiator and a binder polymer to polymerize the polymerizable compound within the exposed area; removing the image-forming layer within the unexposed area while mounting the lithographic plate on a cylinder of a printing press; and then printing with the lithographic plate while mounting the lithographic plate on the cylinder of the printing press. The polymerization initiator is a salt of an anion with a sulfonium ion. According to the present invention, a specific anion or a specific sulfonium ion is used in the polymerization initiator.

20 Claims, No Drawings

LITHOGRAPHIC PROCESS INVOLVING ON PRESS DEVELOPMENT

FIELD OF THE INVENTION

The present invention relates to a lithographic printing plate involving on press development. The invention also relates to a presensitized lithographic plate comprising a hydrophilic support and an image-forming layer containing an infrared absorbing agent, a polymerization initiator, a polymerizable compound and a binder polymer.

BACKGROUND OF THE INVENTION

A lithographic printing plate generally comprises a hydrophobic imaging area, which receives oily ink in a printing process, and a hydrophilic non-imaging area, which receives dampening water. A conventional lithographic process usually comprises steps of masking a presensitized (PS) plate, which comprises a hydrophilic support and a hydrophobic photosensitive resin layer, with a lith film, exposing the plate to light through the lith film, and then developing the plate to remove a non-imaging area with a developing solution.

Nowadays a computer electronically processes, stores and outputs image information as digital data. A presensitized lithographic plate is preferably scanned directly with a highly directive active radiation such as a laser beam without use of a lith film to form an image according to a digital data. The term of Computer to Plate (CTP) means the lithographic process of forming a printing plate according to digital image data without use of a lith film.

The conventional lithographic process of forming a printing plate has a problem about CTP that a wavelength region of a laser beam does not match a spectral sensitivity of a photosensitive resin.

The conventional PS plate requires a step of dissolving and removing a non-imaging area (namely, developing step). The developed printing plate should be further subjected to post-treatments such as a washing treatment using water, a rinsing treatment using a solution of a surface-active agent, and a desensitizing treatment using a solution of gum arabic or a starch derivative. The additional wet treatments are disadvantageous to the conventional PS plate. Even if an early step (image-forming step) in a lithographic process is simplified according to a digital treatment, the late step (developing step) comprises such troublesome wet treatments that the process as a whole cannot be sufficiently simplified.

The printing industry as well as other industries is interested in protection of global environment. Wet treatments inevitably influence global environment. The wet treatments are preferably simplified, changed into dry treatments or omitted from a lithographic process to protect global environment.

A process without wet treatments is referred to as a press development method, which comprises the steps of attaching an exposed presensitized printing plate to a cylinder of a printer, and rotating the cylinder while supplying dampening water and ink to the plate to remove a non-imaging area from the plate. Immediately after exposing the presensitized plate to light, the plate can be installed in a printer. A lithographic process can be completed while conducting a usual printing treatment.

A presensitized lithographic printing plate suitable for the press development method must have a photosensitive layer soluble in dampening water or a solvent of ink. The presensitized plate should easily be treated under room-light to be subjected to a press development in a printer placed under room light.

A conventional PS plate cannot satisfy the above-described requirements.

Japanese Patent No. 2,938,397 (corresponding to European Patent No. 0770494, and U.S. Pat. Nos. 6,030,750 and 6,096,481) discloses a method for making a lithographic printing plate. The method uses an imaging element (presensitized plate) comprising on a hydrophilic surface of a lithographic based an image forming layer comprising hydrophobic thermoplastic polymer particles capable of coalescing under the influence of heat and dispersed in a hydrophilic binder and a compound capable of converting light to heat. The method comprising the steps of imagewise exposing to light the imaging element; and developing a thus obtained imagewise exposed imaging element by mounting it on a print cylinder of a printing press and supplying an aqueous dampening liquid or ink to the image forming layer while rotating the printer cylinder.

The imaging element can be treated under room light because the element has sensitivity within an infrared region.

In the method for making a lithographic printing plate, polymer particles coalesce under the influence of heat converted from light. Imaging elements having particles suitable for a press development often show poor plate wear.

Japanese Patent Publication Nos. 2000-211262, 2001-277740, 2002-29162, 2002-46361, 2002-137562 and 2002-326470 disclose presensitized lithographic printing plate in which microcapsules containing a polymerizable compound are dispersed in place of the thermoplastic polymer particles. An image formed by reaction of the polymerizable compound has stronger durability and gives better plate wear than an image made of the melted and aggregated particles.

SUMMARY OF THE INVENTION

An object of the present invention is to conducting on press development of a presensitized lithographic plate having a high sensitivity.

Another object of the invention is to prepare a lithographic plate improved in having excellent plate wear by on press development.

A further object of the invention is to print with a lithographic plate obtained by on press development.

A furthermore object of the invention is to improve a polymerization initiator used in a presensitized lithographic plate.

The present invention provides a lithographic printing process which comprises the steps of:

imagewise exposing to infrared light a presensitized lithographic plate which comprises a hydrophilic support and an image-forming layer containing an infrared absorbing agent, a polymerization initiator and a binder polymer, said polymerization initiator being a salt of a sulfonium ion with an anion selected from the group consisting of (1) hydrogensulfate ion, (2) a sulfate ester ion, (3) a polymer having a carboxylate ion, (4) a polymer having a sulfonate ion, (5) a polymer having an anion of $-SO_2-N^{-}-R^1$ (wherein $R^1$ is carboxyl, formyl, a aliphatic group, an aromatic group, a heterocyclic group, $-O-R$, $-S-R$, $-CO-R$, $-O-CO-R$ or $-CO-O-R$, and wherein R is an aliphatic group, an aromatic group or a heterocyclic group), (6) a carboxylate ion having an α-carbon atom substituted with an acyl group, carbamoyl, a substituted carbamoyl group or cyano, (7) a carboxylate ion having an α-carbon atom substituted with two or more aromatic groups, and (8) a carboxylate ion having an α-carbon atom to which a non-metallic atom other than carbon and hydrogen is attached, to polymerize the polymerizable compound within the exposed area;

removing the image-forming layer within the unexposed area while mounting the lithographic plate on a cylinder of a printing press; and then printing an image with the lithographic plate while mounting the lithographic plate on the cylinder of the printing press.

The invention also provides a presensitized lithographic plate which comprises a hydrophilic support and an image-forming layer containing an infrared absorbing agent, a polymerization initiator and a binder polymer, said polymerization initiator being a salt of a sulfonium ion with an anion selected from the group consisting of (1) hydrogensulfate ion, (2) a sulfate ester ion, (3) a polymer having a carboxylate ion, (4) a polymer having a sulfonate ion, and (5) a polymer having an anion of —$SO_2$—$N^-$—$R^1$ (wherein $R^1$ is carboxyl, formyl, a aliphatic group, an aromatic group, a heterocyclic group, —O—R, —S—R, —CO—R, —O—CO—R or —CO—O—R, and wherein R is an aliphatic group, an aromatic group or a heterocyclic group).

The invention further provides a lithographic printing process which comprises the steps of:

imagewise exposing to infrared light a presensitized lithographic plate which comprises a hydrophilic support and an image-forming layer containing an infrared absorbing agent, a polymerization initiator and a binder polymer, said polymerization initiator being a salt of an anion with a sulfonium ion which comprises a sulfur atom to which three aromatic groups are attached, at least one of the aromatic groups being substituted with an electron attractive group, to polymerize the polymerizable compound within the exposed area;

removing the image-forming layer within the unexposed area while mounting the lithographic plate on a cylinder of a printing press; and then printing an image with the lithographic plate while mounting the lithographic plate on the cylinder of the printing press.

The invention furthermore provides a presensitized lithographic plate which comprises a hydrophilic support and an image-forming layer containing an infrared absorbing agent, a polymerization initiator and a binder polymer, said polymerization initiator being a salt of an anion with a sulfonium ion which comprises a sulfur atom to which three aromatic groups are attached, at least one of the aromatic groups being substituted with an electron attractive group.

The present inventors have studied a polymerization initiator that can be advantageously used in a lithographic process involving on press development.

In a conventional lithographic process, a lithographic plate has been developed with an alkaline solution. Therefore, a polymerization initiator has been so selected that the polymerization initiator can be easily removed with the alkaline solution.

In a lithographic process involving on press development, a lithographic plate is chemically developed with dampening water or an oily ink, or is mechanically developed with a cylinder of a press. Further, a lithographic process involving on press development requires a polymerization initiator of a high sensitivity. Therefore, a polymerization initiator advantageously used in a lithographic process involving on press development should be different from a conventional polymerization initiator used in a conventional lithographic process.

The present inventors have noted that a salt of a sulfonium ion with an anion can be appropriately used in a lithographic process involving on press development. However, the salt should be further improved to be used in the on press development.

The present inventors have finally found that a salt comprising a specific anion (1) to (8) or a specific sulfonium ion mentioned above can be advantageously used in a lithographic process involving on press development. The specific salt has a high sensitivity, and can be easily removed at the on press development.

Therefore, the on press development can be conducted by using a presensitized lithographic plate having a high sensitivity according to the present invention.

Another object of the invention is to prepare a lithographic plate improved in having excellent plate wear by on press development.

A further object of the invention is to print with a lithographic plate obtained by on press development.

DETAILED DESCRIPTION OF THE INVENTION

[Polymerization Initiator of First Embodiment]

In the present invention, a salt of an anion with a sulfonium ion is used as a polymerization initiator. In the first embodiment of the present invention, a specific anion is used in combination with a sulfonium ion.

The specific anion is selected from the group consisting of (1) hydrogensulfate ion, (2) a sulfate ester ion, (3) a polymer having a carboxylate ion, (4) a polymer having a sulfonate ion, (5) a polymer having an anion of —$SO_2$—$N^-R^1$ (wherein $R^1$ is carboxyl, formyl, a aliphatic group, an aromatic group, a heterocyclic group, —O—R, —S—R, —CO—R, —O—CO—R or —CO—O—R, and wherein R is an aliphatic group, an aromatic group or a heterocyclic group), (6) a carboxylate ion having an α-carbon atom substituted with an acyl group, carbamoyl, a substituted carbamoyl group or cyano, (7) a carboxylate ion having an α-carbon atom substituted with two or more aromatic groups, and (8) a carboxylate ion having an α-carbon atom to which a non-metallic atom other than carbon and hydrogen is attached.

(Sulfonium Ion)

Sulfonium ion is represented by $S^+R_3$, in which R is hydrogen, an aliphatic group, an aromatic group or a heterocyclic group. Two or more groups represented by R can be combined to form a heterocyclic group. R preferably is an aliphatic group, an aromatic group or a heterocyclic group, more preferably is an aliphatic group or an aromatic group, and most preferably is an aromatic group. In other words, the sulfonate ion preferably comprises a sulfur atom to which three aliphatic, aromatic or heterocyclic groups are attached, more preferably comprises a sulfur atom to which three aliphatic or aromatic groups are attached, and most preferably comprises a sulfur atom to which three aromatic groups are attached.

In the present specification, the aliphatic group means an alkyl group, a substituted alkyl group, an alkenyl group, a substituted alkenyl group, an alkynyl group or a substituted alkynyl group. The aliphatic group can have a cyclic or branched structure. The aliphatic group preferably has 1-20 carbon atoms.

Examples of the substituent groups include a halogen atom (F, Cl, Br, I), cyano, nitro, an aromatic group, a heterocyclic group, hydroxyl, mercapto, formyl, carboxyl, amino, carbamoyl, sulfamoyl, —O—R, —S—R, —CO—R, —CO—O—R, —O—CO—R, —NH—R, —CO—NH—R, —NH—CO—R, —$SO_2$—R, —NH—$SO_2$—R, —$SO_2$—NH—R and —N═N—R. R is an aliphatic group, an aromatic group or a heterocyclic group.

In the present specification, the aromatic group means an aryl group or a substituted aryl group. The aromatic group preferably has 6 to 20 carbon atoms.

Examples of the substituent groups include an aliphatic group in addition to the examples of substituent groups of the aliphatic group.

In the present specification, the heterocyclic group includes a non-substituted heterocyclic group and a substituted heterocyclic group. The hetero atom of the heterocyclic group preferably is nitrogen, oxygen or sulfur. The heterocyclic group preferably has a five-membered or six-membered heterocyclic ring. Another ring (a aliphatic ring, an aromatic ring or a heterocyclic ring) can be condensed with the heterocyclic ring. The heterocyclic group preferably has 1-20 carbon atoms.

Examples of the substituent groups include oxo (=O), thio (=S) and imino (=NH or =N—R, in which R is an aliphatic group, an aromatic group or a heterocyclic group) in addition to the examples of substituent groups of the aromatic group.

Examples of sulfonium ions (C1-C18) are shown below.

C1: p-t-Butylphenyldiphenylsulfonium ion
C2: p-Tolyldiphenylsulfonium ion
C3: Bis(p-methoxyphenyl)phenylsulfonium ion
C4: Tris(p-methoxyphenyl)sulfonium ion
C5: p-Hydroxyphenyldiphenylsulfonium ion
C6: Tris(p-tolyl)sulfonium ion
C7: Tris(p-fluorophenyl)sulfonium ion
C8: Benzyldiphenylsulfonium ion
C9: Hexylmethylphenylsulfonium ion
C10: Triphenylsulfonium ion
C11: 2,4,6-Trimethylphenyldiphenylsulfonium ion
C12: Tris(p-t-butylphenyl)sulfonium ion
C13: p-Methoxyphenyldiphenylsulfonium ion
C14: Bis(p-chlorophenyl)phenylsulfonium ion
C15: Bis(p-tolyl)phenylsulfonium ion
C16: Bis(p-chlorophenyl)tolylsulfonium ion
C17: Methyldiphenylsulfonium ion
C18: Tributylsulfonium ion (Hydrogensulfate Ion and Sulfate Ester Ion)

Hydrogensulfate ion is a monovalent anion corresponding to an atomic group formed by removing one hydrogen from molecule of sulfuric acid.

A sulfate ester ion is a monovalent anion consisting of a mono-substituted ester of sulfuric acid. The sulfate ester ion is preferably represented by the formula (I).

$$R—O—SO_3^- \quad (I)$$

In the formula (I), R is an aliphatic group, an aromatic group or a heterocyclic group.

Examples of hydrogensulfate ion (A0) and sulfate ester ions (A1-A95) are shown below.

(A0)

$HOSO_3^{\ominus}$ (A1)

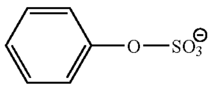

(A2)

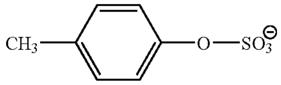

(A3)

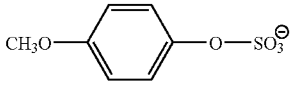

-continued (A4)

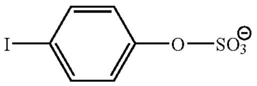

(A5)

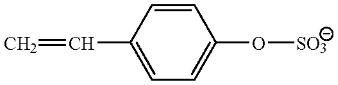

(A6)

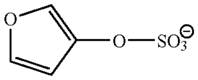

(A7)

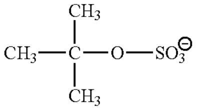

(A8)

$n\text{-}C_4F_9—(CH_2)_2—O—SO_3^{\ominus}$ (A9)

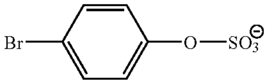

(A10)

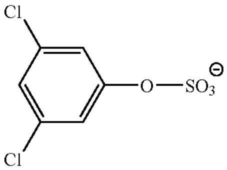

(A11)

$C_2H_5—O—SO_3^{\ominus}$ (A12)

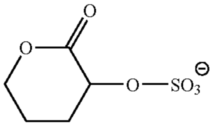

(A13)

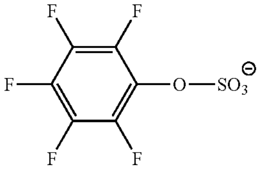

(A14)

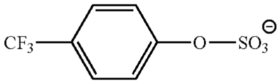

(A15)

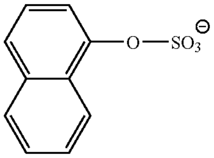

(A16)

$CH_3—O—SO_3^{\ominus}$ (A17)

$CF_3—O—SO_3^{\ominus}$ (A18)

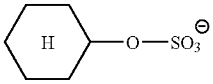

-continued
(A19)
$CCl_3-O-SO_3^{\ominus}$
(A20)
$n\text{-}C_4H_9-O-SO_3^{\ominus}$
(A21)
$HO-CH_2-O-SO_3^{\ominus}$
(A22)
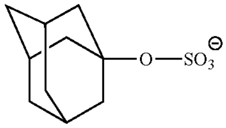
(A23)
$C_{15}H_{31}-O-SO_3^{\ominus}$
(A24)
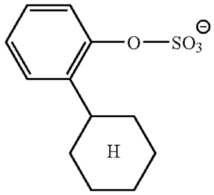
(A25)
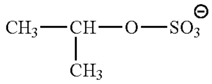
(A26)
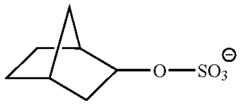
(A27)
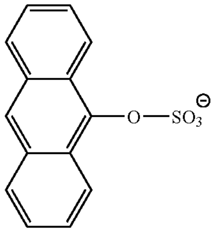
(A28)
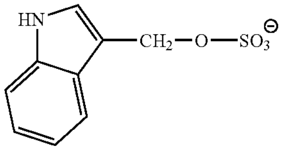
(A29)
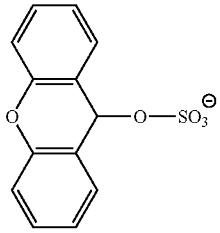
(A30)
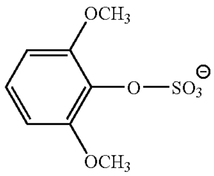
-continued
(A31)
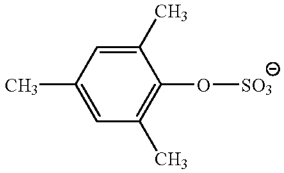
(A32)
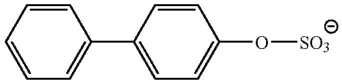
(A33)
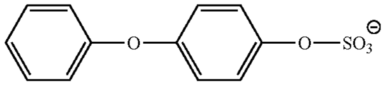
(A34)
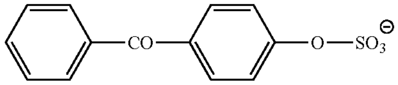
(A35)
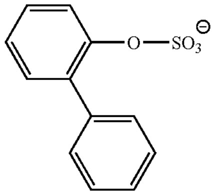
(A36)
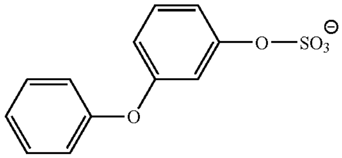
(A37)
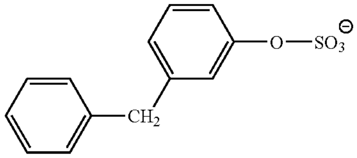
(A38)
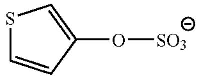
(A39)
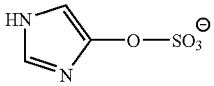
(A40)
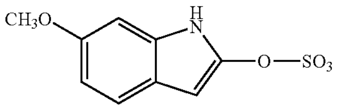
(A41)
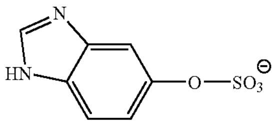
(A42)
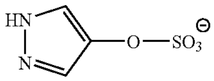

-continued
(A43)
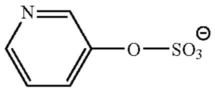
(A44)
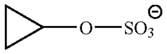
(A45)
$CH_2{=}CH-CH_2-O-SO_3^{\ominus}$
(A46)
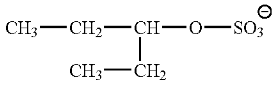
(A47)
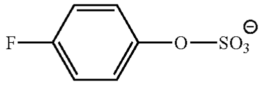
(A48)
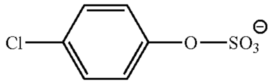
(A49)
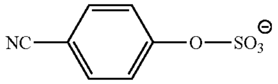
(A50)
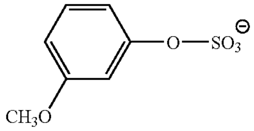
(A51)
$HO-(CH_2)_2-O-SO_3^{\ominus}$
(A52)
$n\text{-}C_8H_{17}-O-SO_3^{\ominus}$
(A53)
$C_{12}H_{25}-O-SO_3^{\ominus}$
(A54)
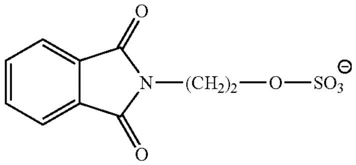
(A55)
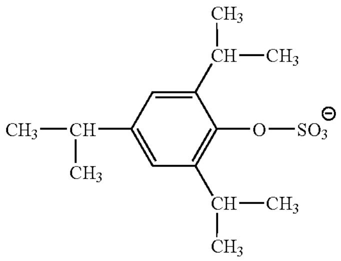
(A56)
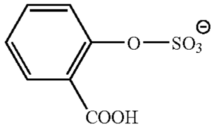
(A57)
$CH_3-S-(CH_2)_2-O-SO_3^{\ominus}$
-continued
(A58)
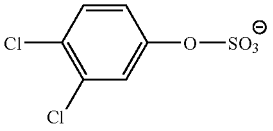
(A59)
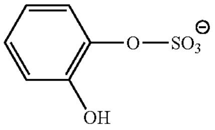
(A60)
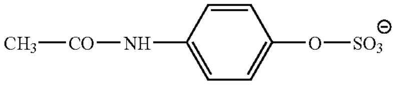
(A61)
$CH_2{=}CH-O-SO_3^{\ominus}$
(A62)
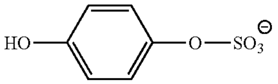
(A63)
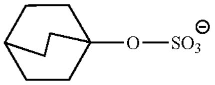
(A64)
$n\text{-}C_4F_9-O-SO_3^{\ominus}$
(A65)
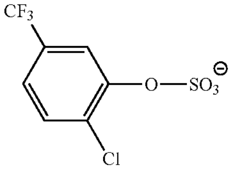
(A66)
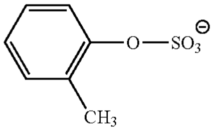
(A67)
$C_8F_{17}-O-SO_3^{\ominus}$
(A68)
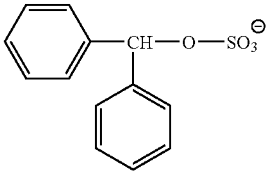
(A69)
$HS-CH_2-O-SO_3^{\ominus}$
(A70)
$CH_3-O-CO-(CH_2)_2-O-SO_3^{\ominus}$
(A71)
$n\text{-}C_{19}H_{39}-O-SO_3^{\ominus}$
(A72)
$CH_3-SO_2-NH-CH_2-O-SO_3^{\ominus}$
(A73)
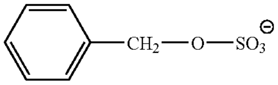

-continued (A74)

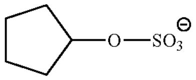

(A75)

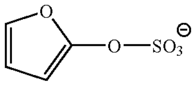

(A76)

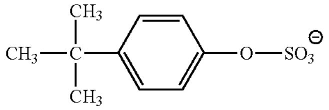

(A77)

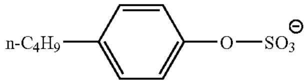

(A78)

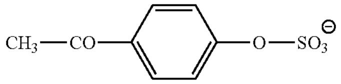

(A79)

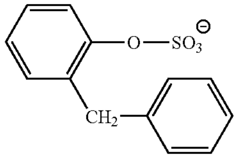

(A80)

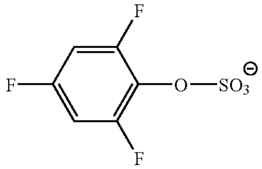

(A81)

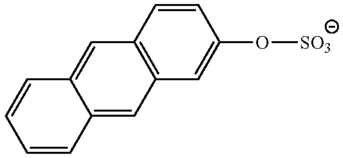

(A82)

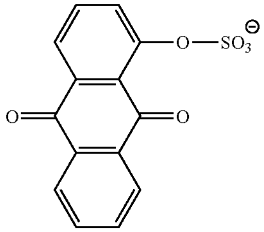

(A83)

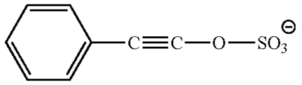

(A84)

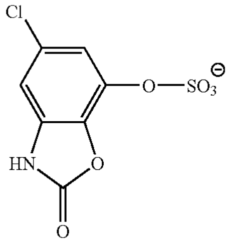

-continued (A85)

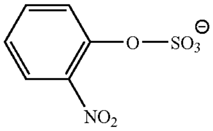

(A86)

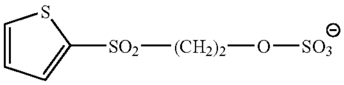

(A87)

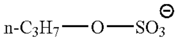

(A88)

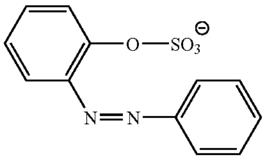

(A89)

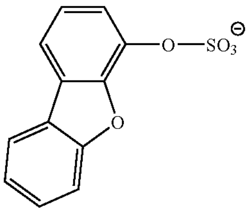

(A90)

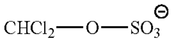

(A91)

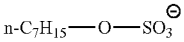

(A92)

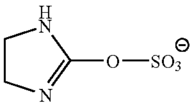

(A93)

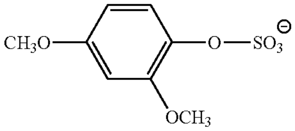

(A94)

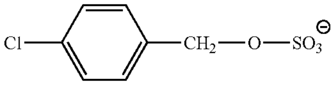

(A95)

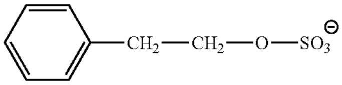

There are no specific limitations with respect to the combinations of the sulfonium ions and the hydrogensulfate or sulfate ester ions. Examples of the salts of the sulfonium ions with the hydrogensulfate or sulfate ester ions are shown below. The following examples refer to the number of the sulfonium ions (C) and the hydrogensulfate or sulfate ester ions (A) For example, (1) C10•A16 means triphenylsulfonium (C10) methanesulfate (A16).

| | | |
|---|---|---|
| (1) C10 · A16 | (2) C10 · A17 | (3) C10 · A0 |
| (4) C10 · A7 | (5) C10 · A21 | (6) C10 · A18 |
| (7) C10 · A67 | (8) C10 · A68 | (9) C10 · A69 |

-continued

| | | |
|---|---|---|
| (10) C10 · A70 | (11) C10 · A44 | (12) C10 · A61 |
| (13) C10 · A71 | (14) C10 · A72 | (15) C10 · A45 |
| (16) C10 · A73 | (17) C10 · A74 | (18) C10 · A75 |
| (19) C10 · A1 | (20) C10 · A2 | (21) C10 · A62 |
| (22) C10 · A59 | (23) C10 · A76 | (24) C10 · A3 |
| (25) C10 · A77 | (26) C10 · A30 | (27) C10 · A31 |
| (28) C10 · A32 | (29) C10 · A33 | (30) C10 · A78 |
| (31) C10 · A35 | (32) C10 · A36 | (33) C10 · A79 |
| (34) C10 · A13 | (35) C10 · A47 | (36) C10 · A58 |
| (37) C10 · A4 | (38) C10 · A14 | (39) C10 · A49 |
| (40) C10 · A80 | (41) C10 · A10 | (42) C10 · A81 |
| (43) C10 · A5 | (44) C10 · A55 | (45) C10 · A82 |
| (46) C10 · A83 | (47) C11 · A73 | (48) C11 · A84 |
| (49) C11 · A85 | (50) C11 · A86 | (51) C12 · A2 |
| (52) C12 · A17 | (53) C12 · A87 | (54) C12 · A88 |
| (55) C12 · A68 | (56) C13 · A1 | (57) C13 · A17 |
| (58) C13 · A89 | (59) C14 · A4 | (60) C14 · A16 |
| (61) C14 · A90 | (62) C15 · A91 | (63) C15 · A92 |
| (64) C16 · A11 | (65) C16 · A0 | (66) C17 · A93 |
| (67) C17 · A78 | (68) C18 · A20 | (69) C18 · A2 |

SYNTHESIS EXAMPLE 1

(Synthesis of Sulfonium Ion C10))

In 800 ml of benzene, 50.9 g of diphenylsulfoxide was dissolved. To the solution, 200 g of ammonium chloride was added. The mixture was refluxed for 24 hours. The reaction mixture was cooled with ice, gradually poured into 2 liter of water. To the mixture, 400 ml of concentrated hydrochloric acid was added. The mixture was heated at 70° C. for 10 minutes. The obtained aqueous solution was washed with ethyl acetate, and filtered off. A solution of 200 g of ammonium iodide in 400 ml of water was added to the filtrate.

Precipitated powder was filtered out, washed with water, washed with ethyl acetate, and dried to obtain 70 g of triphenylsulfonium iodide.

(Synthesis of Salt (1))

In 100 ml of methanol, 7.8 g of triphenylsulfonium iodide was dissolved. To the solution, 4.87 g of silver oxide was added. The mixture was stirred at room temperature for 4 hours. The solution was filtered out. To the filtrate, 2.6 g (excess amount) of sodium methylsulfate was added. To the mixture, 2 ml of concentrated hydrochloric acid was added to start a reaction. The reaction mixture was concentrated. The concentrate was washed with ethyl acetate and hexane, and dried under vacuum to obtain viscous oil.

The obtained oil was dissolved in chloroform, filtered off, and concentrated. The procedure was repeated twice to obtain 7.1 g of salt (1).

SYNTHESIS EXAMPLE 2

(Synthesis of Salt (3))

In 100 ml of methanol, 7.8 g of triphenylsulfonium iodide prepared in Synthesis Example 1 was dissolved. To the solution, 4.87 g of silver oxide was added. The mixture was stirred at room temperature for 4 hours. The solution was filtered out. To the filtrate, 2.20 g of concentrated sulfuric acid was added to start a reaction. The reaction mixture was concentrated. The concentrate was washed with ethyl acetate and hexane, and dried under vacuum to obtain solid.

The obtained solid was washed with ethyl acetate and hexane, and dried under vacuum again to obtain 6.48 g of salt (3).

Other salts can also be prepared in a similar manner to Synthesis Examples by changing starting materials and adjusting reaction conditions appropriately.

A synthesis of sulfonium salt is described in J. Amer. Chem. Soc.; 91; 1969; 145-150.

A salt of a sulfonium ion with a hydrogensulfate or sulfate ester ion has the absorption maximum wavelength preferably of not longer than 400 nm, and more preferably of not longer than 360 nm.

The image-forming layer contains a salt of a sulfonium ion with a hydrogensulfate or sulfate ester ion as a polymerization initiator preferably in an amount of 0.1 to 50 wt. %, more preferably in an amount of 0.5 to 30 wt. %, and most preferably in an amount of 1 to 20 wt. % based on the total solid content of the image-forming layer.

(Anionic Polymer)

Anionic polymer has a carboxylate ion ($—COO^-$), a sulfonate ion ($—SO_3^-$), or an anion of $—SO_2—N^-R^1$. The carboxylate ion is preferred, and an α-keto carboxylate ion (having an α-carbon atom to which carbonyl group is attached) is most preferred.

$R^1$ is carboxyl, formyl, a aliphatic group, an aromatic group, a heterocyclic group, —O—R, —S—R, —CO—R, —O—CO—R or —CO—O—R. R is an aliphatic group, an aromatic group or a heterocyclic group.

The anionic group is preferably present at the side chain of the polymer.

The main chain of the polymer preferably is hydrocarbon, polyurethane, polyurea, polyester, polyamide, polyether, phenol-formaldehyde resin, norbornene resin or a copolymer thereof. Hydrocarbon, polyurethane and polyurea are preferred, and hydrocarbon is most preferred.

The polymer preferably comprises repeating units represented by the formula (II).

(II)

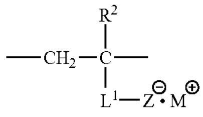

In the formula (II), $R^2$ is hydrogen, a halogen atom, hydroxyl, carboxyl, formyl, amino, carbamoyl, ureido, sulfo, sulfamoyl, an aliphatic group, an aromatic group, a heterocyclic group, —O—R, —S—R, —CO—R, —O—CO—R, —CO—O—R, —NH—R, —NH—CO—R, —CO—NH—R, —NH—CO—NH—R, —NH—CO—O—R, —O—CO—NH—R, $—SO_2—R$, $—NH—SO_2—R$ or $—SO_2—NH—R$. R is an aliphatic group, an aromatic group or a heterocyclic group. $R^2$ preferably is hydrogen, carbamoyl, an aliphatic group, —O—CO—R or —CO—O—R.

In the formula (II), $L^1$ is a single bond or a divalent linking group. The divalent linking group preferably is a divalent aliphatic group, a divalent aromatic group, a divalent heterocyclic group, —O—, —S—, —CO—, —NH—, —NR—, $—SO_2—$ or a combination thereof. R is an aliphatic group, an aromatic group or a heterocyclic group.

In the present specification, the divalent aliphatic group means an alkylene group, a substituted alkylene group, an alkenylene group, a substituted alkenylene group, an alkynylene group or a substituted alkynylene group. The divalent aliphatic group can have a cyclic or branched structure. The divalent aliphatic group preferably has 1-20 carbon atoms. Examples of the substituent groups are the same as the examples of the substituent groups of the aliphatic group.

In the present specification, the divalent aromatic group means an arylene group or a substituted arylene group. The divalent aromatic group preferably has 6 to 20 carbon atoms. Examples of the substituent groups are the same as the examples of the substituent groups of the aromatic group.

In the present specification, the divalent heterocyclic group includes a non-substituted divalent heterocyclic group and a substituted divalent heterocyclic group. The hetero atom of the divalent heterocyclic group preferably is nitrogen, oxygen or sulfur. The divalent heterocyclic group preferably has a five-membered or six-membered heterocyclic ring. Another ring (a aliphatic ring, an aromatic ring or a heterocyclic ring) can be condensed with the heterocyclic ring. The divalent heterocyclic group preferably has 1-20 carbon atoms. Examples of the substituent groups are the same as the examples of the substituent groups of the heterocyclic groups.

In the formula (II), Z is —COO—, —$SO_3$— or —$SO_2$—$N^-$R1, wherein $R^1$ is carboxyl, formyl, a aliphatic group, an aromatic group, a heterocyclic group, —O—R, —S—R, —CO—R, —O—CO—R or —CO—O—R. R is an aliphatic group, an aromatic group or a heterocyclic group.

In the formula (II), M is a sulfonium ion.

Examples of the repeating units represented by the formula (II) are shown below.

(II-1)

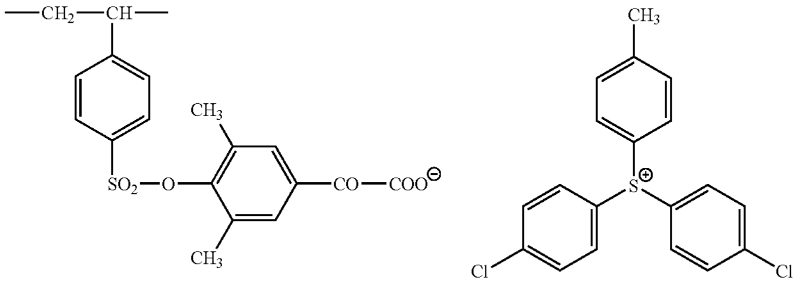

(II-2)

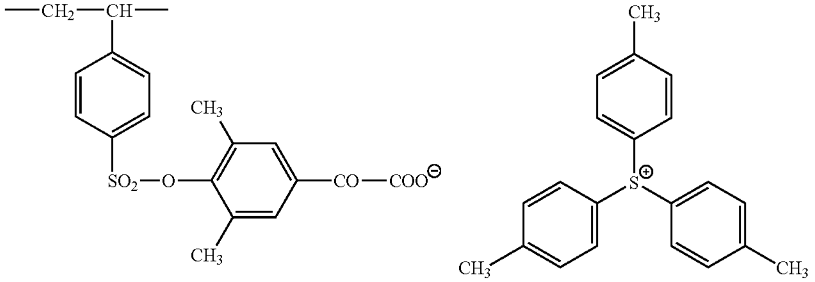

(II-3)

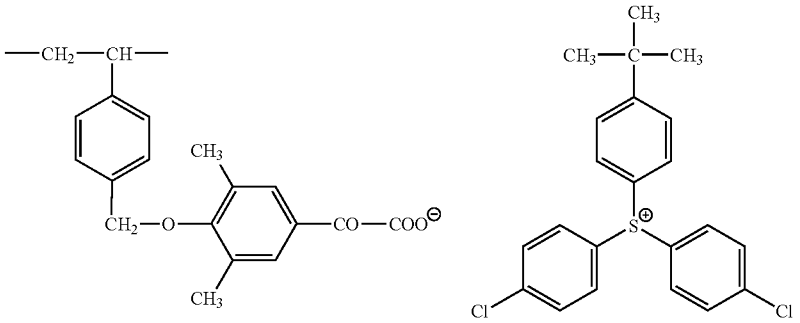

(II-4)

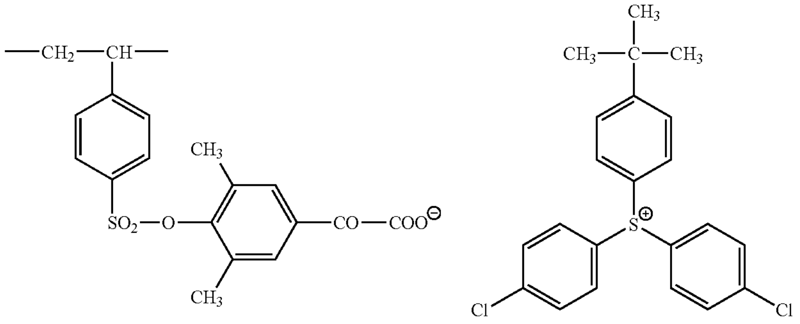

-continued
(II-5)
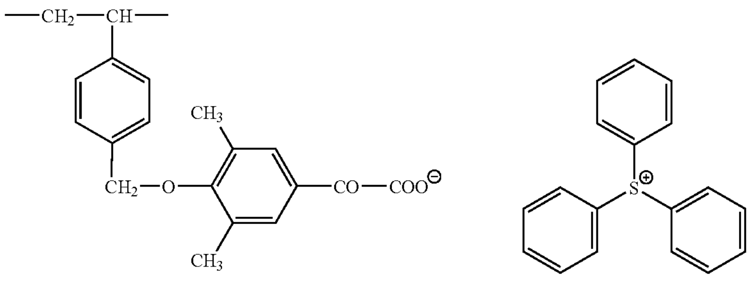
(II-6)
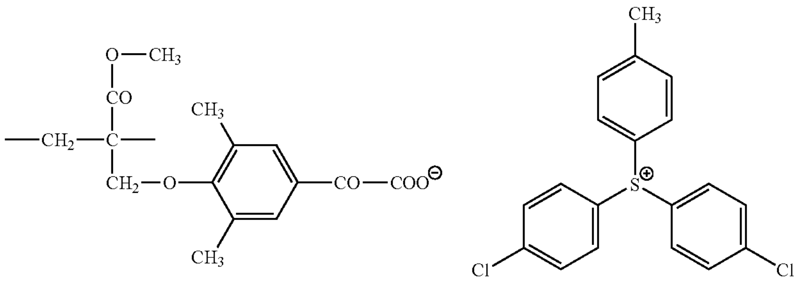
(II-7)
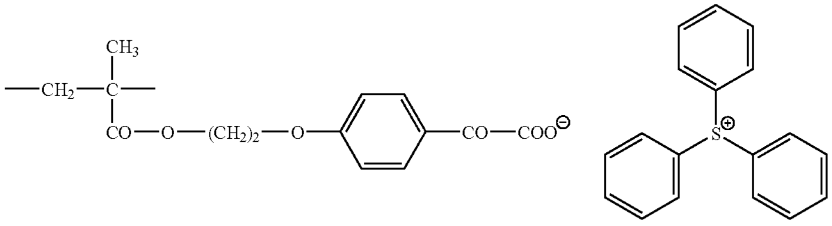
(II-8)
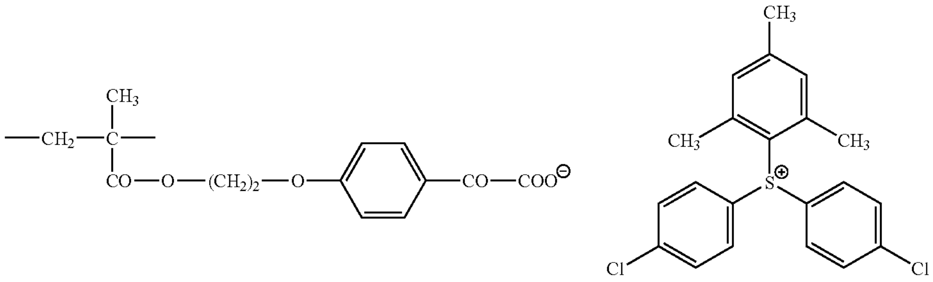
(II-9)
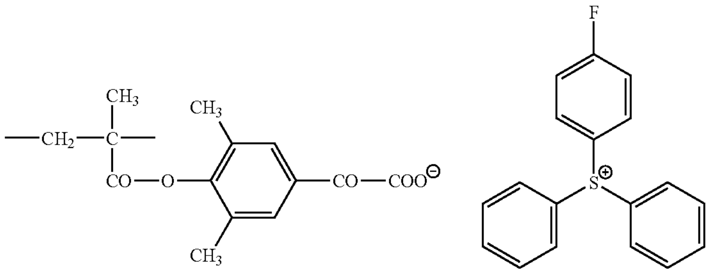

-continued
(II-10)
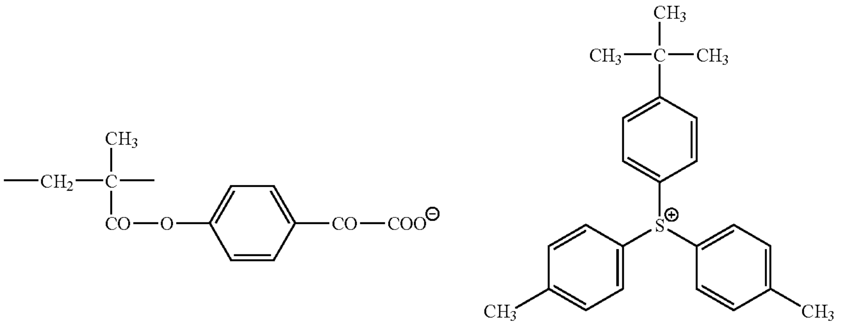
(II-11)
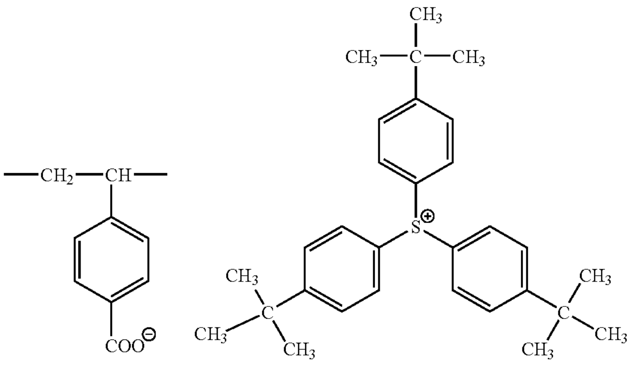
(II-12)
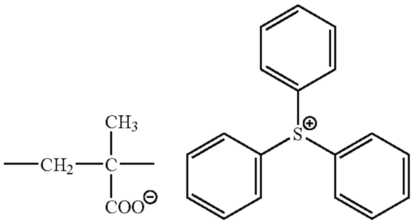
(II-13)
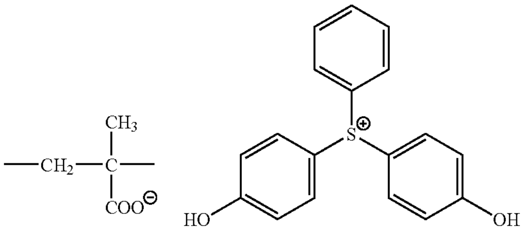
(II-14)
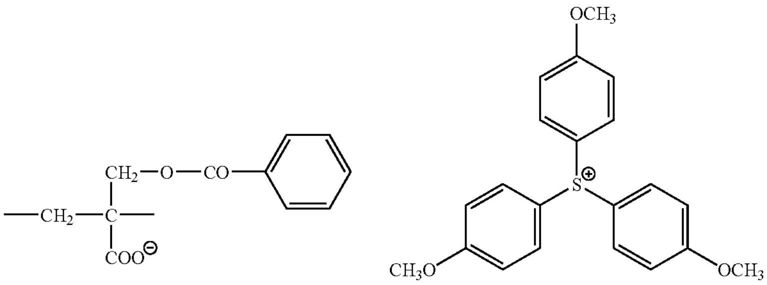
(II-15)
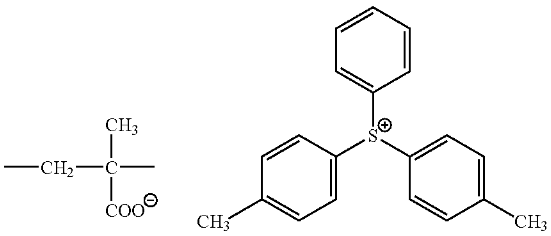

-continued
(II-16)
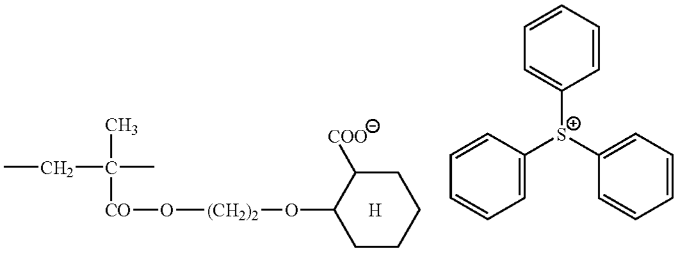
(II-17)
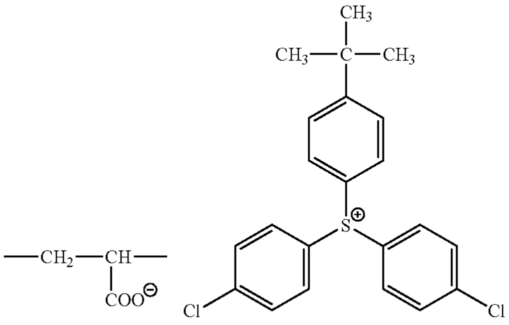
(II-18)
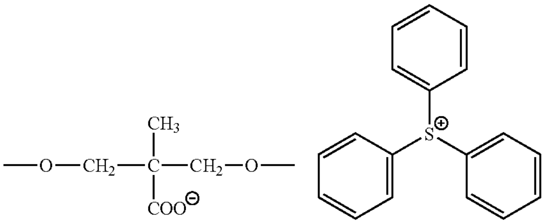
(II-19)
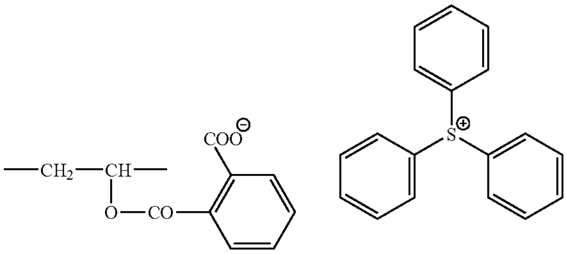
(II-20)
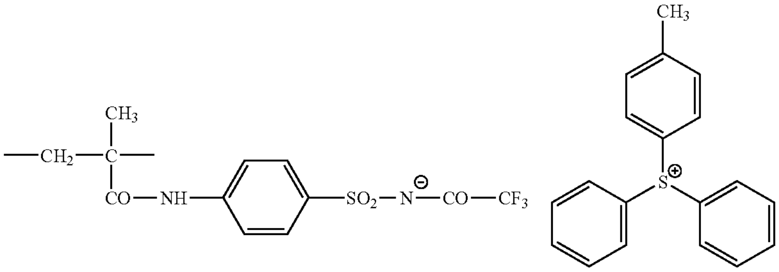
(II-21)
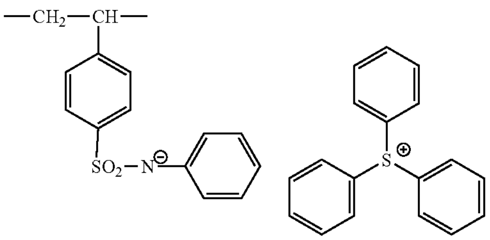
(II-22)
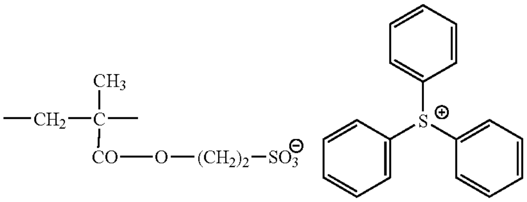

-continued (II-23)

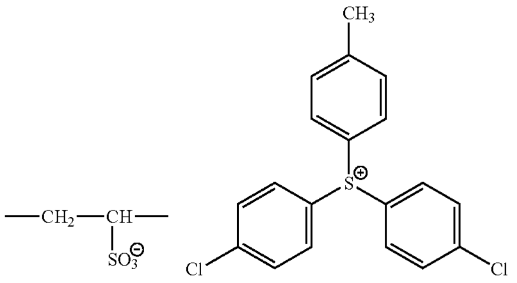

(II-24)

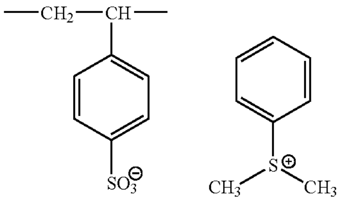

(II-25)

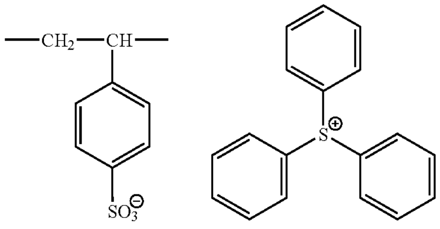

The polymer can be a homopolymer consisting of repeating units having an anionic group and a sulfonium ion as its counter ion. The polymer can also be a copolymer comprising two or more different repeating units having an anionic group and a sulfonium ion as its counter ion. The polymer can further be a copolymer comprising repeating units having an anionic group and a sulfonium ion as its counter ion and other repeating units.

The other repeating units are preferably represented by the formula (III).

(III)

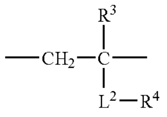

In the formula (III), $R^3$ is hydrogen, a halogen atom, carboxyl, an aliphatic group, —O—CO—R or —CO—O—R. R is an aliphatic group, an aromatic group or a heterocyclic group. $R^3$ preferably is hydrogen or an aliphatic group, more preferably is hydrogen or an alkyl group having 1 to 6 carbon atoms, and most preferably is hydrogen or methyl.

In the formula (III), $L^2$ is a single bond or a divalent linking group. The divalent linking group preferably is a divalent aliphatic group, a divalent aromatic group, a divalent heterocyclic group, —O—, —S—, —CO—, —NH—, —NR—, —$SO_2$— or a combination thereof. R is an aliphatic group, an aromatic group or a heterocyclic group.

In the formula (III), $R^4$ is an aliphatic group, an aromatic group or a heterocyclic group.

Examples of the other repeating units are shown below.

(III-1)

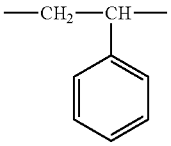

(III-2)

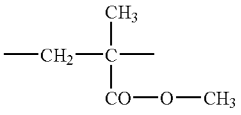

(III-3)

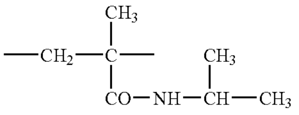

(III-4)

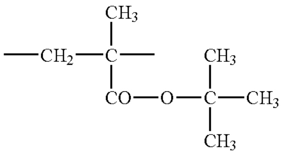

(III-5)

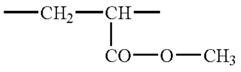

(III-6)

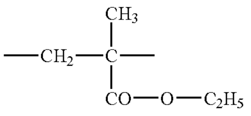

-continued (III-7)

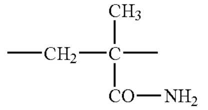

(III-8)

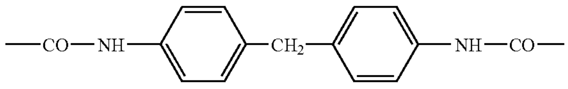

(III-9)

$—CO—NH—(CH_2)_6—NH—CO—$ (III-10)

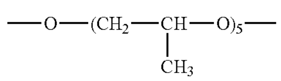

(III-11)

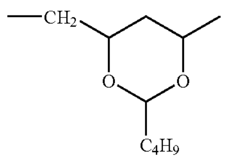

(III-12)

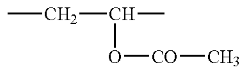

(III-13)

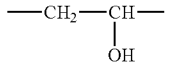

(III-14)

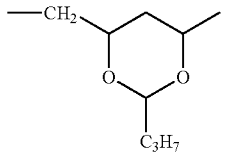

(III-15)

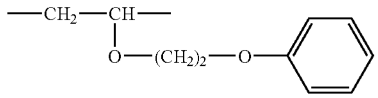

Examples of the copolymers are shown below by referring to the repeating units (II) having an anionic group and a sulfonium ion as its counter ion and other repeating units (III). The ratio of the repeating units means mole %.

| | | | |
|---|---|---|---|
| CP1: | $-(II-2)_{50}-$ | $-(III-1)_{50}-$ | |
| CP2: | $-(II-5)_{40}-$ | $-(III-1)_{60}-$ | |
| CP3: | $-(II-10)_{60}-$ | $-(III-3)_{40}-$ | |
| CP4: | $-(II-13)_{50}-$ | $-(III-4)_{50}-$ | |
| CP5: | $-(II-15)_{40}-$ | $-(III-6)_{30}-$ | $-(III-7)_{30}-$ |
| CP6: | $-(II-18)_{40}-$ $-(III-10)_{10}-$ | $-(III-8)_{40}-$ | $-(III-9)_{10}-$ |
| CP7: | $-(II-19)_{50}-$ $-(III-13)_{10}-$ | $-(III-11)_{30}-$ | $-(III-12)_{10}-$ |
| CP8: | $-(II-22)_{30}-$ | $-(III-6)_{70}-$ | |
| CP9: | $-(II-23)_{50}-$ | $-(III-15)_{50}-$ | |
| CP10: | $-(II-24)_{50}-$ | $-(III-1)_{50}-$ | |

SYNTHESIS EXAMPLE 3

(Synthesis of ethyl 4-hydroxy-3,5-dimethylbenzoylformate)

With 350 ml of nitrobenzene, 133 g of aluminum chloride was mixed at room temperature. The mixture was kept at 0 to 10° C. To the mixture, 136.5 g of ethyl chloroformate was dropwise added for 15 minutes at 0 to 10° C. The mixture was stirred for 15 minutes.

In 150 ml of nitrobenzene, 2,6-dimethylphenol was dissolved. The solution was kept at 0 to 10° C., and dropwise added to the above-prepared mixture for 30 minutes. The mixture was stirred for 2 hours at 0 to 10° C., and for 1 hour at room temperature.

With 2 liters of ice-cold water, 60 ml of concentrated hydrochloric acid was mixed. The above-prepared reaction mixture was calmly poured into the diluted hydrochloric acid. The mixture was extracted with 500 ml of ethyl acetate. The organic phase was dried and concentrated with sodium sulfate. Nitrobenzene was removed under reduced pressure to obtain a solid. The obtained solid was slurried again with 300 ml of diisopropyl ether, and filtered to obtain 149 g of ethyl 4-hydroxy-3,5-dimethylbenzoylformate (yield: 66.8%).

(Synthesis of ethyl 4-(p-vinylbenzenesulfonyloxy)-3,5-dimethylbenzoylformate)

In 80 g of pyridine, 111 g of ethyl 4-hydroxy-3,5-dimethylbenzoylformate was dissolved. The solution was cooled to 0 to 10° C. To the solution, 152 g of p-styrenesulfonyl chloride was dropwise added. The mixture was stirred for 2 hours at 0 to 10° C., and for 2 hours at room temperature.

With 2 liters of ice-cold water, 80 ml of concentrated hydrochloric acid was mixed. The above-prepared reaction mixture was diluted with acetone, and calmly poured into the diluted hydrochloric acid to precipitate a solid. The obtained solid was filtered, and the filtrate was slurried again with 300 ml of methanol to obtain 151 g of ethyl 4-(p-vinylbenzenesulfonyloxy)-3,5-dimethylbenzoylformate. (yield: 77.5%).

(Synthesis of poly(4-(p-vinylbenzenesulfonyloxy)-3,5-dimethylbenzoylformic acid))

In 64 g of methyl ethyl ketone, 31.07 g of ethyl 4-(p-vinylbenzenesulfonyloxy)-3,5-dimethylbenzoylsulfonate) was dissolved. The mixture was stirred at 70° C. under nitrogen atmosphere. To the mixture, 0.64 g of a polymerization initiator (V-65, Wako Pure Chemical Industries Ltd.) was added. The mixture was stirred for 2 hours. To the mixture, 0.32 g of the same polymerization initiator was added. The mixture was stirred for 2 hours. To the mixture, 0.16 g of the same polymerization initiator was added. The mixture was stirred for 2 hours. The mixture was cooled to room temperature, and poured into 1 kg of hexane solution containing 5% of 2-propanol to obtain 27 g of a polymer.

In 30 ml of dimethylacetic acid and 70 ml of 1-methoxy-2-propanol, 7 g of the obtained polymer was dissolved. To the solution, a solution of 1.02 g of potassium hydroxide in 70 ml of water was dropwise added at room temperature. The mixture was stirred for 2 hours, and poured into a mixture of 500 ml of ice-cold water and 20 ml of concentrated hydrochloric acid to precipitate a solid of a carboxylic acid. The solid was filtered and dried to obtain poly(4-(p-vinylbenzenesulfonyloxy)-3,5-dimethylbenzoylformic acid).

(Synthesis of Homopolymer Consisting of Repeating Units (II-1))

In 50 ml of methanol, 1.42 g of bis(p-chlorophenyl) p-tolylsulfonium iodide was dissolved. To the solution, 0.72 g of silver oxide was added. The mixture was stirred for 4 hours at room temperature. The stirred mixture was filtered, and the filtrate was further filtered with a filter of 0.1 μm.

Poly(4-(p-vinylbenzenesulfonyloxy)-3,5-dimethylbenzoylformic acid) was dissolved in 50 ml of acetone and 10 ml of methanol.

The solution of poly(4-(p-vinylbenzenesulfonyloxy)-3,5-dimethylbenzoylformic acid) was dropwise added to the above prepared filtrate. The mixture was concentrated to precipitate a semisolid. The semisolid was washed with ethyl acetate and diisopropyl ether to obtain a homopolymer consisting of repeating units (II-1). The weight average molecular weight was 6,300.

The image-forming layer contains the anionic polymer as a polymerization initiator preferably in an amount of 0.1 to 50 wt. %, more preferably in an amount of 0.5 to 50 wt. %, further preferably in an amount of 3 to 30 wt. %, and most preferably in an amount of 5 to 20 wt. % based on the total solid content of the image-forming layer.

(Carboxylate Ion)

The carboxylate ion can have an α-carbon atom (carbon atom at 2-position) substituted with an acyl group, carbamoyl, a substituted carbamoyl group or cyano.

The carboxylate ion can have a cyclic structure. The cyclic structure can contain carbonyl group of the acyl group or an amido bond of the (substituted) carbamoyl group.

The acyl group means —CO—R, wherein R is an aliphatic group, an aromatic group or a heterocyclic group.

Examples of the substituent groups of the substituted carbamoyl group include an aliphatic group, an aromatic group or a heterocyclic group.

Examples of the carboxylate ions having an α-carbon atom substituted with an acyl group, carbamoyl, a substituted carbamoyl group or cyano are shown below.

A101:Benzoylacetate ion
A102:2-Benzoylpropionate ion
A103:Acetoacetate ion
A104:Cyanoacetate ion
A105:2-Cyanocinnamate ion
A106:2-cyanopropionate ion
A107:5-(3,4,5-Trimethyl-6-oxo-8-hydroxy-3,4,5,6-tetrahydroisochromene)carboxylate ion
A108:4-(3-Oxo-7,7-dimethylbicyclo[2.2.1]heptane)carboxylate ion The carboxylate ion can also have an α-carbon atom (carbon atom at 2-position) substituted with two or more aromatic groups.

Examples of the carboxylate ion can also have an α-carbon atom substituted with two or more aromatic groups are shown below.

A201:Ethylthiodiphenylacetate ion
A202:Hydroxydiphenylacetate ion
A203:Hydroxy(1-naphthyl)phenylacetate ion
A204:Mercaptodiphenylacetate ion
A205:Methoxydiphenylacetate ion
A206:Cyanodiphenylacetate ion
A207:triphenylacetate ion
A208:3,3,3-Trifluoro-2,2-diphenylpropionate ion
A209:Hydroxybis(p-chlorophenyl)acetate ion
A210:Hydroxybis(p-tolyl)acetate ion
A211:2,2-Diphenylpropionate ion
A212:Hydroxyphenyl(p-nitrophenyl)acetate ion
A213:Chlorodiphenylacetate ion
A214:2,2-Di(1-naphthyl)propionate ion
A215:Tris(4-chlorophenyl)acetate ion
A216:2,2-Diphenylbutyrate ion
A217:Diphenylacetate ion The carboxylate ion can also have an α-carbon atom (carbon atom at 2-position) to which a non-metallic atom other than carbon and hydrogen is directly attached. The other non-metallic atoms include halogen atoms (F, Cl, Br, I), O, S, N, Si and P. Halogen atoms, O, S and N are preferred.

The carboxylate ion can have a cyclic structure. The cyclic structure can contain thee non-metallic atom other than carbon and hydrogen.

The non-metallic atom can be directly attached to the α-carbon atom as a divalent or more substituent group (e.g., oxo, thio, imino).

Examples of the carboxylate ion can also have an α-carbon atom to which a non-metallic atom other than carbon and hydrogen is attached, are shown below.

A301:Benzoylformate ion
A302:Pyruvate ion
A303:p-Methoxybenzoylformate ion
A304:Mercaptopyruvate ion
A305:3-Methyl-2-oxobutyrate ion
A306:3-o-Nitrophenyl-2-oxopropionate ion
A307:3-Phenyl-2-oxopropionate ion
A308:p-Chlorobenzoylformate ion
A309:Glyoxylate ion
A310:1-Naphthoylformate ion
A311:N-Phenylcarbamoylformate ion
A312:3-Indolecarbonylformate ion
A313:2-Oxobutyrate ion
A314:p-Acetylbenzoylformate ion
A315:Trifluoropyruvate ion
A316:Pentafluorobenzoylformate ion
A317:2-Oxopentanoate ion
A318:3-p-Chlorophenyl-2-oxopropionate ion
A319:3,5-Dimethoxybenzoylformate ion
A320:Benzenesulfonylacetate ion
A321:3,5-Bis(trifluoromethyl)benzenesulfonylacetate ion
A322:2-Benzenesulfonylpropionate ion
A323:p-Methoxybenzenesulfonylacetate ion
A324:Butanesulfonylacetate ion
A325:Methanesulfonylacetate ion
A326:1-Naphthalenesulfonylacetate ion
A327:2-(1,3-Dioxolane)carboxylate ion
A328:Dimethoxyacetate ion
A329:Methoxyacetate ion
A330:2-Phenoxypropionate ion
A331:Diethylphosphonoacetate ion
A332:2-Hydroxy-2-phenylpropionate ion
A333:3,3,3-Trifluoro-2-phenyl-2-methoxypropionate ion
A334:Phenylthioacetate ion
A335:Benzylthioacetate ion
A336:Acetoxyphenylacetate ion
A337:2-Thiophenecarboxylate ion
A338:1-Oxoisoindoline-2-ylacetate ion
A339:Anilinoacetate ion
A340:2-Acetoamidopropionate ion
A341:2-Anilinopropionate ion
A342:2-Dimethylaminopropionate ion
A343:Acetoamidoacetate ion
A344:Maleimidoacetate ion
A345:p-Methylanilinoacetate ion
A346:p-Methoxyanilinoacetate ion
A347:2-(5-Methylthiophene)carboxylate ion
A348:t-Butyldiphenylsilylacetate ion
A349:Phenylselenoacetate ion
A350:Trifluoroacetoxyphenylacetate ion
A351:p-Methylbenzoylformate ion
A352:2,4,6-Trimethylbenzoylformate ion
A353:4-Fluorobenzoylformate ion
A354:o-Chlorobenzoylformate ion
A355:3,5-Dichlorobenzoylformate ion
A356:p-Aminobenzoylformate ion
A357:5-Indolecarbonylformate ion
A358:3-Furancarbonylformate ion A3.59:2-Thiophenecarbonylformate ion
A360:2-Oxo-5-(pyridine-3-yl)-4-pentenecarboxylate ion
A361:Bromopyruvate ion
A362:2-Oxobutyrate ion
A363:2-Oxopentanoate ion
A364:Cyclohexanecarbonylformate ion
A365:3-Nitrobenzoylformate ion
A366:3,5-Bis(trifluoromethyl)benzoylformate ion
A367:Trichloropyruvate ion
A368:p-Hydroxybenzoylformate ion
A369:Methylthioacetate ion
A370:p-Chlorophenylthioacetate ion
A371:Butylphenylaminoacetate ion
A372:3-(1,2,3,4-Tetrahydroisoquinoline)carboxylate ion
A373:2-Benzyloxycarbonylaminopropionate ion
A374:2-Benzyloxycarbonylamino-3-methylbutyrate ion
A375:Tritylaminoacetate ion
A376:2-(1-Benzyloxycarbonylpyrrolidine)carboxylate ion
A377:Nitroacetate ion
A378:2-(2,4,5-Trichlorophenoxy)propionate ion
A379:Phenoxyacetate ion
A380:2-Naphthyloxyacetate ion
A381:2-Isopropyl-5-methylcyclohexyloxyacetate ion
A382:2-oxolanecarboxylate ion
A383:3,3,3-trichloro-2,2-dihydroxypropionate ion
A384:Maleimidooxyacetate ion
A385:2-(1-Methylpyrrole)carboxylate ion
A386:2-Pyrrolecarboxylate ion
A387:2-(5-Bromofuran)carboxylate ion
A388:4-Imidazolecarboxylate ion
A389:2-(5-Methoxyindole)carboxylate ion
A390:Hydroxyacetate ion
A391:Trichloroacetate ion
A392:Perfluorononanoate ion
A393:Trifluoroacetate ion
A394:2,4-Dioxotetrahydrothiazole-3-ylacetate ion
A395:2-Chloropropionate ion
A396:Chloroacetate ion
A397:Perfluorodecanoate ion
A398:Bromophenylacetate ion
A399:Phenylmethoxyacetate ion
A400:Trifluoromethylphenylmethoxyacetate ion
A401:Hydroxyphenylacetate ion
A402:2-(4-Oxo-4H-chromene)carboxylate ion
A403:t-Butoxycarbonylaminoacetate ion
A404:5-(2-Pyrrolidone)carboxylate ion
A405:4-(2-Oxoimidazolidine)carboxylate ion
A406:4-(2-Oxotetrahydrothiazole)carboxylate ion
A407:p-Methylbenzenesulfonylacetate ion
A408:Pentafluorobenzenesulfonylacetate ion
A409:p-Methoxyphenoxyacetate ion
A410:2-Furancarboxylate ion
A411:Mercaptoacetate ion There are no specific limitations with respect to the combinations of the sulfonium ions and the carboxylate ions. Examples of the salts of the sulfonium ions with the carboxylate ions are shown below. The following examples refer to the number of the sulfonium ions (C) and the carboxylate ions (A). For example, (101) C10•A301 means triphenylsulfonium (C10) benzoylformate (A301)

| | | |
|---|---|---|
| (101)C10 · A301 | (102)C10 · A302 | (103)C10 · A303 |
| (104)C10 · A304 | (105)C10 · A305 | (106)C10 · A306 |
| (107)C1 · A307 | (108)C1 · A308 | (109)C14 · A309 |
| (110)C14 · A310 | (111)C14 · A311 | (112)C12 · A301 |

-continued

| | | |
|---|---|---|
| (113)C12 · A312 | (114)C17 · A313 | (115)C17 · A314 |
| (116)C15 · A301 | (117)C14 · A301 | (118)C10 · A320 |
| (119)C10 · A407 | (120)C10 · A408 | (121)C12 · A325 |
| (122)C12 · A320 | (123)C12 · A321 | (124)C12 · A322 |
| (125)C13 · A323 | (126)C10 · A101 | (127)C10 · A102 |
| (128)C10 · A103 | (129)C10 · A104 | (130)C2 · A327 |
| (131)C2 · A328 | (132)C10 · A329 | (133)C10 · A330 |
| (134)C10 · A105 | (135)C3 · A331 | (136)C5 · A332 |
| (137)C10 · A333 | (138)C10 · A334 | (139)C10 · A335 |
| (140)C10 · A336 | (141)C10 · A409 | (142)C6 · A204 |
| (143)C6 · A337 | (144)C10 · A338 | (145)C10 · A339 |
| (146)C10 · A340 | (147)C7 · A341 | (148)C8 · A342 |
| (149)C10 · A201 | (150)C10 · A202 | (151)C10 · A203 |
| (152)C10 · A204 | (153)C11 · A205 | (154)C11 · A207 |
| (155)C11 · A208 | (156)C11 · A209 | (157)C11 · A210 |
| (158)C11 · A211 | (159)C10 · A339 | (160)C10 · A379 |
| (161)C10 · A390 | (162)C10 · A392 | (163)C10 · A411 |
| (164)C10 · A393 | (165)C10 · A395 | (166)C10 · A107 |
| (167)C18 · A391 | (168)C18 · A382 | (169)C10 · A337 |
| (170)C10 · A410 | (171)C10 · A336 | |

The salt of the sulfonium ion with the carboxylate ion and the synthesis processes are described in Japanese Patent Provisional Publication Nos. 2001-343742 and 2002-148790.

The salt of the sulfonium ion with the carboxylate ion has a solubility in water at 25° C. preferably of not less than 5 wt. %, more preferably of not less than 10 wt. %, further preferably of not less than 20 wt. %, furthermore preferably of not less than 30 wt. %, and most preferably of not less than 40 wt. %. The solubility means the amount (g) of the salt dissolved in 100 g of water.

The image-forming layer contains the salt of the sulfonium ion with the carboxylate ion as a polymerization initiator preferably in an amount of 0.1 to 50 wt. %, more preferably in an amount of 0.1 to 30 wt. %, further preferably in an amount of 0.5 to 25 wt. %, furthermore preferably in an amount of 1 to 20 wt. %, and most preferably in an amount of 5 to 15 wt. % based on the total solid content of the image-forming layer.

Two or more polymerization initiators of the first embodiment can be used in combination. The polymerization initiator of the first embodiment can be used in combination with the polymerization initiator of the second embodiment (described below). The polymerization initiator of the first and second embodiments can be used in combination of other polymerization initiators. The other polymerization initiators include known triazine compounds, borate compounds, azo compounds, peroxide compounds, lophine dimeres and acylphosphine compounds. In the case that the polymerization initiator of the first and second embodiments is used in combination of other polymerization initiators, the amount of the other polymerization initiators is preferably less than 30 wt. %, and more preferably less than 10 wt. % based on the total amount of the polymerization initiators.

[Polymerization Initiator of Second Embodiment]

In the present invention, a salt of an anion with a sulfonium ion is used as a polymerization initiator. In the second embodiment of the present invention, a specific sulfonium ion is used in combination with an anion.

The specific sulfonium ion comprises a sulfur atom to which three aromatic groups are attached, at least one of the aromatic groups being substituted with an electron attractive group.

A salt of a triarylsulfonium ion with an anion has been known as a polymerization initiator, for example described in J. Amer. Chem. Soc. Vol. 112 (16), 1990, pp. 6004-6015; J. Org. Chem. 1988, pp. 5571-5573, International Publication No. 02/081,439, European Patent No. 1113005.

The aromatic group preferably is phenyl, a substituted phenyl, naphthyl or a substituted naphthyl, and more preferably is phenyl or a substituted phenyl.

At least one of the aromatic groups is substituted with an electron attractive group.

In the case that the sulfonium ion has one electron attractive group, the electron attractive group has Hammett's substitution constant preferably of more than 0.46, more preferably of more than 0.50, and most preferably of more than 0.60. The Hammett's substitution constant preferably is less than 4.0, more preferably is less than 3.5, and most preferably is less than 3.0.

In the case that the sulfonium ion has two or more electron attractive groups, the electron attractive group have Hammett's substitution constant of more than 0.46, more preferably of more than 0.50, and most preferably of more than 0.60 in total. The Hammett's substitution constant preferably is less than 4.0, more preferably is less than 3.5, and most preferably is less than 3.0.

The Hammett's substitution constants are described in various documents (such as Naoki Inamoto, Seminar of Chemistry Vol. 10, Hammett's rule—structure and reactivity (1983), Maruzen, written in Japanese).

The electron attractive groups include a halogen atom, a halogenated alkyl group, an acyl group, an acyloxy group, an alkanesulfinyl group, cyano, an amido group and carboxyl.

The halogen atoms include fluorine (Hammett's substitution constant at meta position (m): 0.34, Hammett's substitution constant at para position (p): 0.06), chlorine (m: 0.37, p: 0.23), bromine (m: 0.39, p: 0.23) and iodine (m: 0.35, p: 0.18). A Hammett's substitution constant at ortho position (o) is the almost same as the constant at para position (p).

Examples of the halogenated alkyl groups include trifluoromethyl (m: 0.43, p: 0.54).

Examples of the acyl groups include acetyl (m: 0.37, p: 0.45) and formyl (m: 0.36, p: 0.43).

Examples of the alkanesulfinyl groups include methanesulfinyl (m: 0.52, p: 0.45).

Cyano has Hammett's substitution constants of 0.56 (m) and 0.66 (p).

Examples of the amido groups include acetamido (m: 0.21, p: 0.00).

Carboxyl has Hammett's substitution constants of 0.37 (m) and 0.45 (p).

The electron attractive group preferably is a halogen atom or a halogenated alkyl group, more preferably is fluorine, chlorine, bromine or trifluoromethyl, and most preferably is chlorine.

Two or more aromatic groups can be substituted with the electron attractive groups. The three aromatic groups are preferably substituted with a halogen atom, and more preferably substituted with chlorine atom.

Examples of the specific sulfonium ions comprising a sulfur atom to which three aromatic groups are attached are shown below.

C101:Tris(m-fluorophenyl)sulfonium ion
C102:Tris(p-chlorophenyl) sulfonium ion
C103:Bis(p-bromophenyl)p-chlorophenylsulfonium ion
C104:Bis(p-fluorophenyl)p-trifluorophenylsulfonium ion
C105:Bis(p-chlorophenyl)4-acetyloxy-3,5-dimethylphenylsulfonium ion
C106:Bis(3,5-dichlorophenyl)phenylsulfonium ion
C107:Tris(3-chloro-4-fluorophenyl)sulfonium ion
C108:Bis(3,5-difluorophenyl)p-tolylsulfonium ion
C109:Bis(p-trifluoromethylphenyl)p-tolylsulfonium ion
C110:Bis(pentafluorophenyl)phenylsulfonium ion
C111:Tris(m-trifluoromethlphenyl)sulfonium ion
C112:Bis(pentafluorophenyl)p-methoxyphenylsulfonium ion
C113:Bis(p-chlorophenyl)p-fluorophenylsulfonium ion
C114:Bis(p-trifluoromethylphenyl)phenylsulfonium ion
C115:Tris(3,4-difluorophenyl)sulfonium ion
C116:Tris(m-chlorophenyl) sulfonium ion
C117:Bis(m-trifluoromethylphenyl)phenylsulfonium ion In the second embodiment, examples of the anions include a sulfonate ion, a sulfinate ion, a carboxylate ion (e.g., benzoylformate ion), a borate ion, a halide ion ($F^-$, $Cl^-$, $Br^-$, $I^-$), sulfate ion ($SO_3^{2-}$), hydrogensulfate ion ($HSO_3^-$), hexafluorophosphate ion ($PF_6^-$), tetrafluoroborate ion ($BF_4^-$) or perchlorate ion ($ClO_4^-$). The sulfonate ion and the benzoylformate ion are preferred, and the sulfonate ion is more preferred.

Examples of the anions are shown below.

A501:Trifluoromethanesulfonate ion
A502:p-Toluenesulfonate ion
A503:Tetrafluoroborate ion
A504:Hexafluorophosphate ion
A505:Benzoate ion
A506:2,4,6-Trimethylbenzenesulfonate ion
A507:Pyruvate ion
A508:Benzenesulfoante ion
A509:Benzoylformate ion
A510:o-Sulfobenzimide anion
A511:Benzensulfinate ion
A512:1-Naphthalenesulfonate ion
A513:Pentafluorobenzenesulfonate ion
A514:Perfluorobutanesulfonate ion
A515:Perchlorate ion
A516:Trifluoroacetate ion
A517:Benzenethiosulfonate ion
A518:p-Acetylbenzoate ion
A519:Bromide ion
A520:p-Hydroxybenzenesulfonate ion
A521:Diphenylhydroxyacetate ion
A522:2,4,6-Triisopropylbenzensulfonate ion
A523:Hydrogensulfate ion
A524:Trichloroacetate ion
A525:o-Carboxybenzensulfonate ion
A526:Bicyclo[2,2,1]heptane-2-carboxylate ion
A527:Methanesulfonate ion
A528:p-Methylthiobenzoylformate ion
A529:p-Toluenesulfinate ion
A530:Bis(benzenesulfonyl)amine anion
A531:Parmitate ion
A532:p-Chlorobenzenesulfonate ion
A533:p-Trifluoromethylbenzoate ion
A534:2-Naphthalenesulfonate ion
A535:1,2-Dioxo-1,2-dihydronaphthalene-4-sulfonate ion
A536:Benzensulfonylmethanesulfonylamine anion
A537:7,7-Dimethyl-2-oxobicyclo[2,2,1]heptan-1-ylmethanesulfonate ion
A538:Dichloroacetate ion There are no specific limitations with respect to the combinations of the sulfonium ions and the anions. Examples of the salts of the sulfonium ions with the anions are shown below. The following examples refer to the number of the sulfonium ions (C) and the carboxylate ions (A). For example, (201) C101•A501 means tris(m-fluorophenyl)sulfonium (C101) trifluoromethanesulfonate (A501)

| | | |
|---|---|---|
| (201)C101 · A501 | (202)C101 · A502 | (203)C101 · A503 |
| (204)C101 · A504 | (205)C101 · A505 | (206)C101 · A506 |
| (207)C101 · A507 | (208)C101 · A508 | (209)C102 · A501 |
| (210)C102 · A502 | (211)C102 · A503 | (212)C102 · A504 |
| (213)C102 · A509 | (214)C102 · A510 | (215)C102 · A511 |
| (216)C102 · A512 | (217)C102 · A506 | (218)C102 · A513 |
| (219)C102 · A514 | (220)C102 · A515 | (221)C102 · A516 |
| (222)C102 · A517 | (223)C102 · A518 | (224)C102 · A519 |
| (225)C103 · A520 | (226)C103 · A504 | (227)C103 · A521 |
| (228)C103 · A522 | (229)C103 · A523 | (230)C103 · A524 |
| (231)C104 · A501 | (232)C104 · A502 | (233)C104 · A503 |
| (234)C104 · A504 | (235)C104 · A518 | (236)C104 · A525 |
| (237)C104 · A526 | (238)C104 · A527 | (239)C105 · A501 |
| (240)C105 · A508 | (241)C105 · A503 | (242)C105 · A515 |
| (243)C105 · A528 | (244)C105 · A510 | (245)C105 · A529 |
| (246)C105 · A512 | (247)C105 · A530 | (248)C105 · A513 |
| (249)C105 · A514 | (250)C105 · A531 | (251)C106 · A502 |
| (252)C106 · A504 | (253)C106 · A521 | (254)C106 · A522 |
| (255)C106 · A501 | (256)C106 · A524 | (257)C107 · A501 |
| (258)C107 · A532 | (259)C107 · A503 | (260)C107 · A504 |
| (261)C107 · A533 | (262)C107 · A534 | (263)C107 · A535 |
| (264)C108 · A501 | (265)C108 · A502 | (266)C108 · A504 |
| (267)C108 · A515 | (268)C108 · A528 | (269)C108 · A510 |
| (270)C108 · A529 | (271)C108 · A512 | (272)C108 · A536 |
| (273)C108 · A513 | (274)C108 · A537 | (275)C104 · A521 |
| (276)C104 · A522 | (277)C104 · A538 | (278)C109 · A501 |
| (279)C109 · A502 | (280)C109 · A503 | (281)C109 · A504 |
| (282)C109 · A533 | (283)C109 · A534 | (284)C109 · A513 |
| (285)C109 · A522 | (286)C110 · A501 | (287)C110 · A502 |
| (288)C111 · A501 | (289)C112 · A527 | (290)C113 · A501 |
| (291)C113 · A502 | (292)C113 · A503 | (293)C114 · A514 |
| (294)C114 · A502 | (295)C114 · A504 | |

The anionic group can be contained in a polymer. The main chain of the polymer preferably is hydrocarbon.

The polymer preferably comprises repeating units represented by the formula (IV).

(IV)

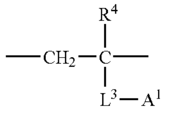

In the formula (IV), $R^4$ is hydrogen or an alkyl group having 1 to 6 carbon atoms, $L^3$ is single bond or a divalent linking group, and $A^1$ is an anionic group.

$R^4$ preferably is hydrogen or methyl.

$L^3$ preferably is single bond or a divalent linking group selected from a group consisting of —CO—, —O—, —NH—, an arylene group, an alkylene group and a combination thereof.

$A^1$ preferably is an anionic group selected from a group consisting of a sulfonate ion, a sulfinate ion, a carboxylate ion, a borate ion and a halide ion.

Examples of the repeating units represented by the formula (IV) are shown below.

(IV-1)

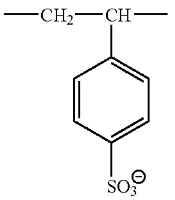

-continued (IV-2)

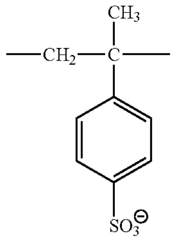

(IV-3)

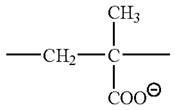

(IV-4)

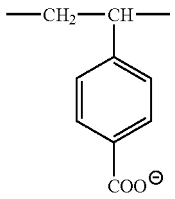

There are no specific limitations with respect to the combinations of the sulfonium ions and the repeating units. Examples of the repeating units having the sulfonium salts are shown below. The following examples refer to the number of the sulfonium ions (C) and the repeating units (IV).

| | | | | |
|---|---|---|---|---|
| IV-1 · C107 | IV-1 · C108 | IV-1 · C106 | IV-1 · C101 | IV-1 · C102 |
| IV-1 · C103 | IV-1 · C113 | IV-2 · C104 | IV-2 · C105 | IV-3 · C102 |
| IV-3 · C101 | IV-4 · C115 | IV-4 · C116 | IV-4 · C102 | IV-4 · C117 |

The polymer can be a homopolymer consisting of repeating units having a sulfonium salt. The polymer can also be a copolymer comprising two or more different repeating units having a sulfonium salt. The polymer can further be a copolymer comprising repeating units having a sulfonium salt and other repeating units.

The other repeating units are preferably represented by the formula (III) described above the first embodiment.

Examples of the copolymers are shown below by referring to the repeating units (IV) having a sulfonium salt and other repeating units (III).

| | | |
|---|---|---|
| CP101: | -(IV-3 · C102)- | -(III-2)- |
| CP102: | -(IV-3 · C101)- | -(III-2)- |
| CP103: | -(IV-1 · C102)- | -(III-1)- |
| CP104: | -(IV-1 · C101)- | -(III-1)- |

The image-forming layer contains the salt of the sulfonium ion with the carboxylate ion as a polymerization initiator preferably in an amount of 0.1 to 50 wt. %, more preferably in an amount of 0.5 to 30 wt. %, and most preferably in an amount of 1 to 20 wt. % based on the total solid content of the image-forming layer.

Two or more polymerization initiators of the second embodiment can be used in combination. The polymerization initiator of the second embodiment can be used in combination with the polymerization initiator of the first embodiment (described above). The polymerization initiator of the first and second embodiments can be used in combination of other polymerization initiators (described about the first embodiment). In the case that the polymerization initiator of the first and second embodiments is used in combination of other polymerization initiators, the amount of the other polymerization initiators is preferably less than 30 wt. %, and more preferably less than 10 wt. % based on the total amount of the polymerization initiators.

[Infrared Absorbing Agent]

A presensitized lithographic plate is preferably exposed to infrared light by scanning the plate with an infrared laser bean having a wavelength of 760 to 1,200 nm. Accordingly, an infrared absorbing agent preferably has a function of absorbing the infrared laser bean having a wavelength of 760 to 1,200 nm.

The infrared absorbing agent can further have a function of converting light to heat. The formed thermal energy can decompose a polymerization initiator (a radical precursor) to form a radical, which further causes a polymerization reaction.

The infrared absorbing agent can further have another function as an infrared sensitizer, which can convert light to a chemical energy, which excites a polymerization initiator to cause a polymerization reaction.

The infrared absorbing agent can have two or more above-mentioned functions.

The infrared absorbing agent preferably is an infrared absorbing dye. The infrared absorbing agent is commercially available. The infrared absorbing dyes are described in "Handbook of Dyes (written in Japanese)", 1970, edited by Association of Organic Synthetic Chemistry.

Examples of the infrared absorbing dyes include azo dyes, metal complex salt azo dyes, pyrazolone azo dyes, naphthoquinone dyes (described in Japanese Patent Provisional Publication Nos. 58(1983)-112793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063, 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595).

Methine dyes are preferred. Cyanine dyes (described in British Patent No. 434,875, U.S. Pat. No. 4,973,572, Japanese Patent Provisional Publication Nos. 58(1983)-125246, 59(1984)-84356, 59(1984)-216146 and 60(1985)-78787) are more preferred.

The cyanine dye is defined by the following formula.

-Bo–Lo=Bs (Cyanine dye)

In the formula, Bs is a basic nucleus, Bo is an onium form of a basic nucleus, and Lo is a methine chain consisting of an odd number of methines.

In the infrared absorbing methine dye, Lo preferably is a methine chain consisting of seven methines.

The centered methine (at the meso-position) can have a substituent group. Examples of the substituent groups include a halogen atom, diphenylamino, —O—R, —S—R, —NH—R and 1-pyridinio.

R is an aliphatic group (preferably has 1 to 12 carbon atoms), an aromatic group (preferably has 6 to 12 carbon atoms) and a heterocyclic group (preferably has 1 to 12 carbon atoms).

The 1-pyridinio group can have a substituent group or a counter anion. Examples of the substituent groups include an alkyl group, an aryl group, amino, a substituted amino group and a halogen atom. Examples of the counter anions include a halide ion, a perchlorate ion, tetrafluoroborate ion, hexafluorophosphate ion and an arylsulfonate ion, The two methins neighboring the centered methine (at the meso-position) can have a substituent group such as a hydrocarbon (aliphatic or aromatic) group having 1 to 12 carbon atoms. The two substituent group can be combined to form a five-membered or six-membered ring.

The other methines of the methine chain may have a substituent group, such as a hydrocarbon (aliphatic or aromatic) group having 1 to 12 carbon atoms. However, the other methines preferably have no substituent groups.

Each of the two basic nuclei preferably has a five-membered heterocyclic ring containing at least one nitrogen atom. A hydrocarbon (aliphatic or aromatic) group is preferably attached to the nitrogen atom. The hydrocarbon group can have a substituent group. Examples of the substituent groups include an alkoxy group having 1 to 12 carbon atoms, carboxyl and sulfo.

The five-membered heterocyclic ring having at least one nitrogen atom (in which the nitrogen atom is the 1-position) preferably attached to the methine chain at the 1-position of the heterocyclic ring. The five-membered heterocyclic ring having at least one nitrogen atom preferably has sulfur atom or carbon atom substituted with two alkyl groups having 1 to 12 carbon atoms (dimethylmethylene) at 3-position. The five-membered heterocyclic ring having at least one nitrogen atom is preferably condensed with an aromatic ring (e.g., benzene ring, naphthalene ring). The aromatic ring is preferably condensed between 4-position and 5-position of the five membered ring. The aromatic ring can have a substituent group. Examples of the substituent groups include a hydrocarbon (aliphatic or aromatic) group, a halogen atom, an alkoxy group having 1 to 12 carbon atoms, an acyl group and a halogenated alkyl group having 1 to 12 carbon atoms.

The cyanine dye can have a counter anion. The molecular structure of the cyanine dye can have an anionic group as a substituent group in place of the counter anion. Examples of the counter anions include a halide ion, perchlorate ion, tetrafluoroborate ion, hexafluorophosphate ion and a sulfonate ion. Perchlorate ion, hexafluorophosphate ion and an arylsulfonate ion are preferred.

Examples of the cyanine dyes are shown below.
(1)
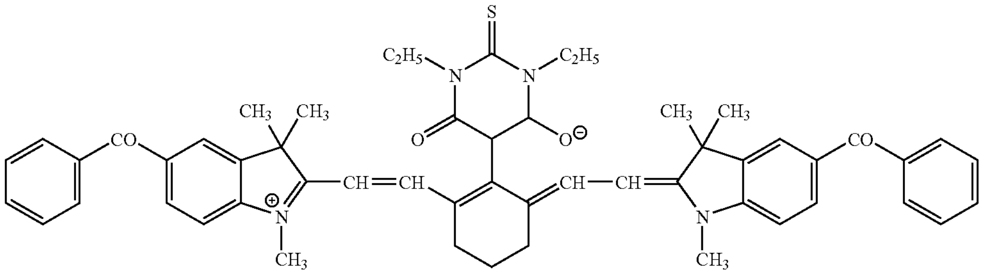
(2)
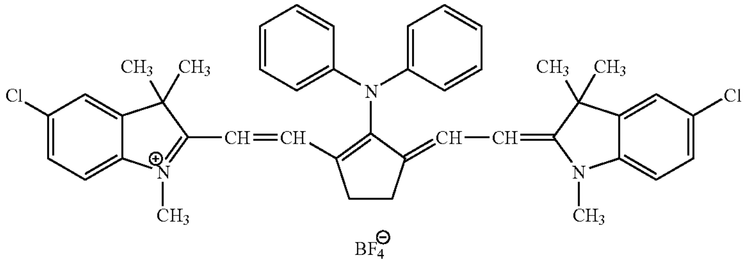
$BF_4^{\ominus}$
(3)
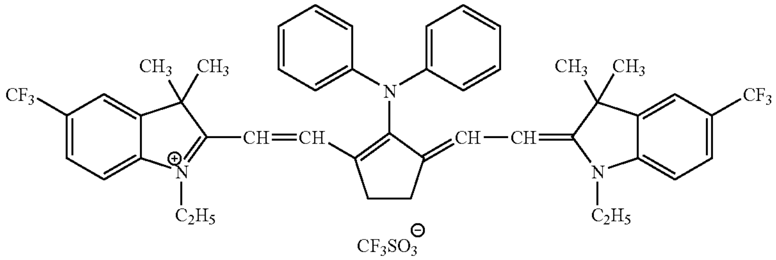
$CF_3SO_3^{\ominus}$
(4)
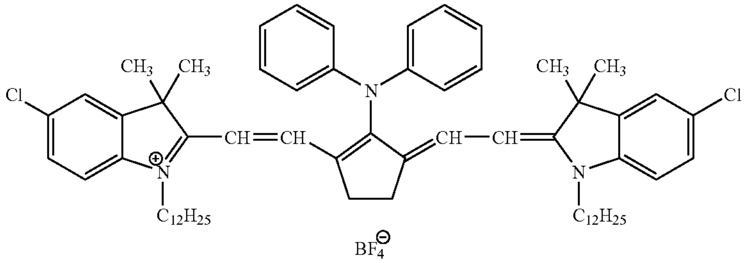
$BF_4^{\ominus}$
(5)
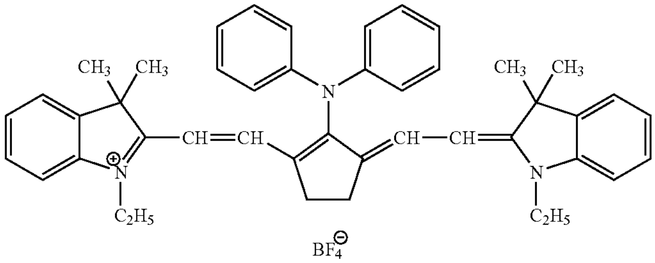
$BF_4^{\ominus}$ -continued (6)

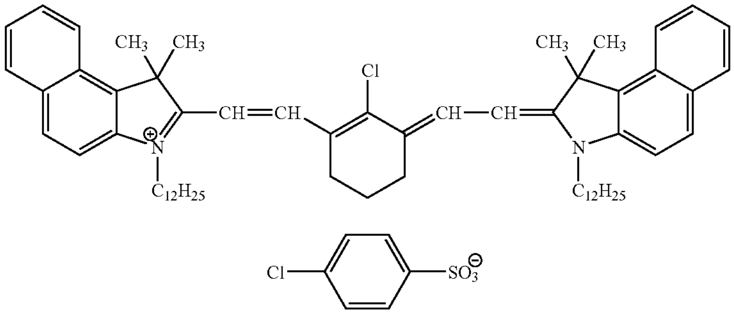

An infrared absorbing pigment can be used as an infrared absorbing agent.

The pigments are described in "Handbook of Color Index (CI)", "Latest Handbook of pigments (written in Japanese)", 1977, edited by Japan Association of Pigment Technology, "Latest Application Technology of Pigment (written in Japanese)", 1986, published by CMC, and "Technology of Printing Ink (written in Japanese)", 1984, published by CMC.

Pigments include black pigments, yellow pigments, orange pigments, brown pigments, red pigments, purple pigments, blue pigments, green pigments, fluorescent pigments, metallic powder pigments, polymer combined pigments, azo lake pigments, condensed azo pigments, chelate azo pigment, phthalocyanine pigments, anthraquinone pigments, perylene pigments, perinone pigments, thioindigo pigments, quinacridone pigments, dioxazine pigments, isoindolinone pigments, quinophthalone pigments, dyed lake pigments, azine pigments, nitroso pigments, nitro pigments, natural pigments, inorganic pigments and carbon black. Carbon black is the most preferred infrared absorbing pigment.

The infrared absorbing pigment can be subjected to a surface treatment. Examples of the surface treatments include a process of coating the surface with a resin or a wax, a process of attaching a surface active agent to the surface, a process of combining the pigment surface with a reactive substance (e.g., silane coupling agent, an epoxy compound, a polyisocyanate). The surface treatment is described in "Characteristics and Applications of Metal Soap (written in Japanese)", edited by SaiwaiShobo, "Technology of Printing Ink (written in Japanese)", 1984, published by CMC, and "Latest Application Technology of Pigment (written in Japanese)", 1986, published by CMC.

The pigment has an average particle size preferably in the range of 0.01 to 10 μm, more preferably in the range of 0.05 to 1 μm, and most preferably in the range of 0.1 to 1 μm. The average particle size is so adjusted to improve stability of the pigment particles in a coating solution or to form a uniform layer.

The pigments can be dispersed by a known dispersing method, which is usually used in preparation of ink or toner. The dispersing machines include an ultrasonic dispersing machine, a sand mill, an Attritor, a pearl mill, a super mill, a ball mill, an impeller, a disperser, a KD mill, a colloid mill, Dynatron, a three-rolls mill and a pressure needer. The dispersing method is described in "Latest Application Technology of Pigment (written in Japanese)", 1986, published by CMC. The image-forming layer contains the infrared absorbing agent preferably in an amount of 0.1 to 20 wt. %, and more preferably in an amount of 1 to 10 wt. % based on the total amount of the image-forming layer.

The image-forming layer can comprises two or more layers, one of which can contain the infrared absorbing agent, and the other of which can contain the other components, such as a polymerization initiator, a polymerizable compound and a binder polymer.

The absorption at the maximum absorption wavelength (within the wavelength region of 760 to 1,200 nm) is preferably adjusted in the range of 0.3 to 1.2, and more preferably in the range of 0.4 to 1.1 measured according to a reflection method. The absorption is adjusted to conduct uniform polymerization reaction throughout the image-forming layer along the thickness direction, which improve membrane strength of the image area and adhesion between the support and the image area.

The absorption of the image-forming layer can be controlled by adjusting the amount of the infrared absorbing agent and the thickness of the image-forming layer. The absorption can be determined according to a conventional method. For example, the absorption can be determined by forming an image-forming layer (having a thickness adjusted to a dry thickness required in a lithographic plate) on a reflective support (such as an aluminum plate); and measuring the reflection density by a densitometer. The absorption can also be measured by a spectrophotometer according to a reflection method using an integrated sphere.

[Polymerizable Compound]

The polymerizable compound preferably is an ethylenically unsaturated polymerizable compound, which has at least one ethylenically unsaturated double bond. The ethylenically unsaturated double bond can cause an addition polymerization reaction. The polymerizable compound preferably has two or more ethylenically unsaturated bond. The ethylenically unsaturated bond is preferably present at the end of the molecular structure of the polymerizable compound.

The polymerizable compound can be in the form of an oligomer (dimer, trimer, tetramer) or a prepolymer.

The polymerizable compound preferably is an unsaturated carboxylic acid (e.g., acrylic acid, methacrylic acid, itaconic acid, crotonic acid, isocrtonic acid, maleic acid), an ester thereof or an amide thereof. The polymerizable compound more preferably is an ester of a polyhydric alcohol with an unsaturated carboxylic acid or an amide of an aliphatic polyamine with an unsaturated carboxylic acid.

The unsaturated carboxylic acid can have a substituent group such as a nucleophilic group (e.g., hydroxyl, amino, mercapto) or an elimination group (e.g., a halogen atom, tosyloxy).

An addition reaction product of an isocyanate or an epoxy compound with an unsaturated carboxylic acid can also be used as a polymerizable compound. An unsaturated carboxylic anhydride can also be used as a polymerizable compound. A reaction product formed by using an unsaturated phosphoric acid, styrene or vinyl ether in place of the unsaturated carboxylic acid can also be used as a polymerizable compound.

Examples of the acrylic esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl)isocyanulate and polyesteracrylate oligomer.

Examples of the methacrylic esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis(p-(3-methacryloxy-2-hydroxypropoxy)phenyl]dimethylmethane and bis[p-(methacryloyloxyethoxy)phenyl]dimethylmethane.

Examples of the itaconic esters include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of the crotonic esters include ethylene glycol dicrotonate, tetramethylene glycol dicrotonate, pentaerythritol dicrotonate and sorbitol tetradicrotonate.

Examples of the isochriotonic esters include ethylene glycol dilsocrotonate, pentaerythritol diisocrotonate and sorbitol tetraisocrotonate.

Examples of the maleic esters include ethylene glycol dimaleate, triethylene glycol dimaleate, pentaerythritol dimaleate and sorbitol tetramaleate.

The other polymerizable esters are described in Japanese Patent Publication Nos. 46(1971)-27926, 51(1976)-47334, Japanese Patent Provisional Publication Nos. 57(1982)-196231, 59(1984)-5240, 59(1984)-5241, 1(1989)-165613 and 2(1990)-226149.

Examples of the amides include methylene-bis(acrylamide), methylenebis(methacrylamide), 1,6-hexamethylenebis(acrylamide), 1,6-hexamethylenebis(methacrylamide), diethylenetriaminetris(acrylamide), xylylenebis (acrylamide) and xylylenebis(methacrylamide).

The other polymerizable amides are described in Japanese Patent Publication No. 54(1979)-21726.

A urethane compound having an ethylenically unsaturated bond can also be used as a polymerizable compound. The polymerizable urethane compound is described in Japanese Patent Publication No. 48(1973)-41708. A urethane compound having two or more ethylenically unsaturated groups can be synthesized by an addition reaction of a polyisocyanate compound having two or more isocyanate groups in its molecule with an unsaturated alcohol represented by $CH_2{=}CRCOOCH_2CHROH$ (wherein R is hydrogen or methyl).

The polymerizable compounds further include a urethane acrylate (described in Japanese Patent Provisional Publication No. 51(1976)-37193, Japanese Patent Publication Nos. 2(1991)-16765, 2(1991)-32293), a urethane compound containing ethylene oxide units (described in Japanese Patent Publication Nos. 56(1981)-17654, 58(1983)-49860, 62(1987)-39417, 62(1987)-39418), a polymerizable compound for addition polymerization having an amino or sulfide structure (described in Japanese Patent Provisional Publication Nos. 63(1988)-260909, 63(1988)-277653, 1(1990)-105238).

The polymerizable compounds furthermore include a polyester acrylate, an epoxy acrylate formed by a reaction of an epoxy resin with (meth)acrylic acid (described in Japanese Patent Provisional Publication No. 48(1973)-64183, Japanese Patent Publication Nos. 49(1974)-43191, 52(1977)-30490), a vinyl phosphonate compound (described in Japanese Patent Provisional Publication No. 2(1990)-25493), a perfluoroalkyl compound (described in Japanese Patent Provisional Publication No. 61(1886)-22048).

The other polymerizable compounds are described in Japanese Patent Publication Nos. 46(1971)-43946, 1(1990)-40336 and 1(1990)-40337.

The polymerizable compounds further include photocurable monomers and oligomers described in Journal of Japan Adhesive Society, Vol. 20, No. 7, pp. 300-308 (1984).

Two or more polymerizable compounds can be used in combination.

The polymerizable compound preferably has two or more unsaturated groups in one molecule to improve the sensitivity. The polymerizable compound preferably has three or more unsaturated groups to improve the strength of the image (namely hardened) area. Two ore more polymerizable compounds can be used in combination to adjust the sensitivity and the strength.

The polymerizable compound is selected in consideration of dissolving or dispersing the other components of the image forming layer (e.g., denatured polyvinyl alcohol, infrared absorbing agent, polymerization initiator). A polymerizable compound of low purity or a mixture of two or more polymerizable compound sometimes has an advantage in dissolving or dispersing the other components.

A specific molecular structure can be introduced into the polymerizable compound to improve an adhesion between the image-forming layer and another layer, for example a support or an overcoating layer.

The polymerizable compound is contained in the image-forming layer preferably in an amount of 5 to 80 wt. %, and more preferably in an amount of 25 to 75 wt. %.

[Binder Polymer]

A binder polymer preferably is a linear organic polymer that can form a coated membrane.

Examples of the polymers include poly(meth)acrylic acid, poly(meth)acrylic ester, poly(vinyl acetal), polyurethane, polyamide, polyether (epoxy resin), polystyrene and novolak polyphenyl.

The binder polymer is preferably cross-linkable to enhance a coated membrane. The binder polymer can have a cross-linkable group (e.g., ethylenically unsaturated bond) in its main chain or side chain. The cross-linkable group can be introduced into the binder polymer by a copolymerization.

Examples of the polymers having cross-linkable groups in the main chains include poly-1,4-butadiene, poly-1,4-isoprene, natural or synthetic rubber.

The polymer having a cross-linkable group in the side chain preferably is a polymer of acrylic or methacrylic ester or amide in which the residue of the ester or amide (R of —COOR or —CONHR) contains an ethylenically unsaturated bond.

Examples of the residues containing ethylenically unsaturated bond (corresponding to R mentioned above) include $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)-O-CO-CR^1{=}CR^2R^3$, and $-(CH_2CH_2O)_n-X$ (in which each of $R^1$, $R^2$ and $R^3$ independently is hydrogen, a halogen atom, an alkyl, aryl, alkoxy or aryloxy group having 1 to 20 carbon atoms, $R^1$ and $R^2$ or $R^3$ can be combined to form a ring, n is an integer of 1 to 10, X is a cyclopentadienyl residue).

Examples of the ester residues include $-CH_2CH{=}CH_2$ (described in Japanese Patent Publication No. 7(1995)-21633), $-CH_2CH_2O-CH_2CH{=}CH_2$, $-CH_2C(CH_3){=}CH_2$, $-CH_2CH{=}CH-C_6H_5$, $-CH_2CH_2-NHCOO-CH_2CH{=}CH_2$ and $-CH_2CH_2O-X$ (in which X is a cyclopentadienyl residue).

Examples of the amide residues include $-CH_2CH{=}CH_2$, $-CH_2CH_2O-X$ (in which X is a cyclopentadienyl residue) and $-CH_2CH_2-OCO-CH{=}CH_2$.

The cross-linkable binder polymer can be hardened by forming a cross-link between polymers. The cross-link can be formed by addition polymerization, which is caused between polymers directly or in a polymerization reaction of the polymerizable compound by adding a free radical (polymerization initiator radical or a propagation radical in polymerization reaction of the polymerizable compound) to a cross-linkable group of the binder polymer. The cross-link can also be formed between polymer molecules by reacting polymer radicals, which are formed by removing an atom (for example, hydrogen on carbon atom neighboring the cross-linkable group) from the polymer.

The binder polymer preferably contains the cross-linkable group preferably in an amount of 0.1 to 10.0 mmol, more preferably in an amount of 1.0 to 7.0 mmol, and most preferably in an amount of 2.0 to 5.5 mmol based on 1 g of the binder polymer. The amount of the cross-linkable group (for example, unsaturated double bond for radical polymerization reaction) can be measured by iodine titration. The amount of the cross-linkable group is adjusted to control the sensitivity and stability of the presensitized lithographic plate.

The binder polymer is preferably dissolved or dispersed in an ink or dampening water to develop the image-forming layer (to remove unexposed area) at the on press development. The binder polymer is preferably hydrophobic to be dissolved or dispersed in the ink. The binder polymer is preferably hydrophilic to be dissolved or dispersed in dampening water. A hydrophilic binder polymer and a hydrophobic binder polymer can be used in combination in the present invention.

The hydrophilic binder polymer has a hydrophilic group. Examples of the hydrophilic groups include hydroxyl, carboxyl, carboxylate, hydroxyethyl, a polyoxyethylene group, hydroxypropyl, a polyoxypropylene group, amino, aminoethyl, aminopropyl, an ammonium group, an amido group, carboxymethyl, sulfo and phospho.

Examples of the hydrophilic polymers include polysaccharides (e.g., gum arabic, starch derivative, carboxymethylcellulose, its sodium salt, cellulose acetate, sodium alginate), protein (e.g., casein, gelatin), polyvinyl acetate, polymaleic acid, polystyrene, polyhydroxyethyl methacrylate, polyhydroxyethyl acrylate, polyhydroxypropyl methacrylate, polyhydroxypropyl acrylate, polyhydroxybutyl methacrylate, polyhydroxybutyl acrylate, polyethylene glycol, polyhydroxypropylene, polyvinyl alcohol, partially hydrated (preferably of not less than 60 wt. %, more preferably of not less than 80 wt. %) polyvinyl acetate, polyvinyl formal, poly(vinyl butyral), polyvinyl pyrrolidone, polyacrylamide, polymethacrylamide, poly(N-methylolacrylamide), Nylon soluble in alcohol, polyether of 2,2-bis(4-hydroxyphenyl) propane and epichlorohydrin, and copolymers thereof. Examples of the copolymers include vinyl acetate-maleic acid copolymer, styrene-maleic acid copolymer.

The binder polymer has a weight average molecular preferably of not less than 5,000, more preferably in the range of 10,000 to 300,000. The binder polymer has a number average molecular weight of not less than 1,000, more preferably in the range of 2,000 to 250,000. The index of the polydispersion of the polymer (ratio of weight average molecular weight per number average molecular weight) is preferably in the range of 1.0 to 10.

In the case that the binder polymer is a copolymer, the copolymer can be a random polymer, a block polymer or a graft polymer. The copolymer preferably is a random polymer.

The binder polymer can be synthesized according to a known method. In the synthesis of the polymer, a solvent is usually used. Examples of the solvents include an ether (e.g., tetrahydrofuran), a halogenated hydrocarbon (e.g., ethylene chloride), a ketone (e.g., cyclohexanone, methyl ethyl ketone, acetone), an alcohol (e.g., methanol, ethanol, 1-methoxy-2-propanol), an ether (e.g., ethylene glycol monomethyl ether, ethylene glycol monoethyl ether, diethylene glycol dimethyl ether), an ester (e.g., 2-methoxyethyl acetate, 1-methoxy-2-propyl acetate, ethyl acetate, methyl lactate, ethyl lactate), an amide (e.g., dimethylformamide, N,N-dimethylacetamide), a hydrocarbon (e.g., toluene), a sulfoxide (e.g., dimethylsulfoxide) and water. Two or more solvents can be used in combination.

A known radical polymerization initiator such as an azo initiator or a peroxide initiator can be used in synthesis of the binder polymer.

Two or more binder polymers can be used in combination.

The binder polymer is contained in the image-forming layer preferably in an amount of 10 to 90 wt. %, more preferably in an amount of 20 to 80 wt. %, and most preferably in an amount of 30 to 70 wt. % based on the total solid content of the image-forming layer. The amount of the binder polymer is adjusted to improve the strength of the image and to accelerate the image formation.

The weight ratio of the polymerizable compound to the binder polymer is preferably in the range of 1/9 to 7/3.

[Microcapsule]

The polymerizable compound is preferably contained in microcapsules, and the binder polymer is preferably arranged outside the microcapsules.

The image-forming layer containing microcapsules is described in Japanese Patent Provisional Publication Nos. 2001-277740 and 2001-277742.

The microcapsules can be prepared according to a coacervation method (describe in U.S. Pat. Nos. 2,800,457, 2,800,458), an interfacial polymerization method (described in U.S. Pat. No. 3,287,154, Japanese Patent Publication No. 38(1963)-19574, 42(1967)-446), a polymer precipitation method (described in U.S. Pat. Nos. 3,418,250, 3,660,304), a method using isocyanate-polyol as wall material (described in U.S. Pat. No. 3,796,669), a method using isocyanate as wall material (described in U.S. Pat. No. 3,914,511), a method using urea-formaldehyde or urea-formaldehyde-resorcinol as wall material (described in U.S. Pat. Nos. 4,001,140, 4,087,376, 4,089,802), a method using melamine-formaldehyde resin or hydroxycellulose as wall material (described in U.S. Pat. No. 4,025,445), an in situ method of monomer polymerization (described in Japanese Patent Publication Nos. 36(1961)-9163, 51(1976)-9079), a spray drying method (described in British Patent No. 930,422, U.S. Pat. No., 3,111, 407) and an electrophore sis dispersion cooling method (described in British Patent Nos. 952,807, 967,074).

The microcapsule shell preferably has a three-dimensional cross-linking, which can be swelled with a solvent. The microcapsule shell preferably comprises a polyurea, a polyurethane, a polyester, a polycarbonate, a polyamide, a copolymer thereof or a mixture thereof. The shell more preferably comprises a polyurea, a polyurethane, a copolymer thereof or a mixture thereof. An ethylenically unsaturated bond can be introduced into the polymer of the microcapsule shell.

The microcapsules have an average particle size preferably in the range of 0.01 to 3.0 μm, more preferably in the range of 0.05 to 2.0 μm, and most preferably in the range of 0.10 to 1.0 μm. The average particle size is adjusted to improve the resolution of the image and the stability of the microcapsules.

The microcapsules can be fused with heat. The contents of the microcapsules can ooze out or into the shell of the microcapsules in preparation of the presensitized lithographic plate. The contents of the microcapsules can be reacted with a hydrophilic resin or a low molecular weight compound contained in the image-forming layer. Two or more different microcapsules can be contained in the image-forming layer. In the case that the different microcapsules have different thermally reactive functional groups, the microcapsules can be reacted with each other. The reaction of the microcapsules is preferably conducted to fuse the microcapsules, which can form a stable image.

The microcapsules are contained in the image-forming layer preferably in an amount of not less than 50 wt. %, and more preferably in the range of 60 to 95 wt. % based on the total solid contents of the image-forming layer. The amount of the microcapsules are adjusted to conduct on press development, to improve the sensitivity and to improve the print wear.

In preparation of the microcapsules, a solvent is added to a microcapsule dispersion. The solvent preferably swells the microcapsule shell as well as dissolves the contents of the microcapsules. The solvent having a function of swelling the microcapsule shell can accelerate diffusion of the contents into outside the microcapsules. The solvent having a function of swelling the microcapsule shell is determined depending on the dispersing medium of the microcapsules, the shell polymer of the microcapsules, the thickness of the shell and the contents of the microcapsules. In the case that microcapsules have a shell of cross-linked urea or polyurethane are dispersed in water, an alcohol (e.g., methanol, ethanol, propanol, t-butanol), an ether (e.g., tetrahydrofuran, propylene glycol monomethyl ether, ethylene glycol diethyl ether, ethylene glycol monomethyl ether), acetal, an ester (e.g., methyl lactate, ethyl lactate, γ-butyllactone), a ketone (e.g., methyl ethyl ketone), a glycol, a polyol, an amide (e.g., dimethylfomamide, N,N-dimetylacetamide), an amine or an fatty acid is preferably used as the solvent. The solvent is commercially available. Two or more solvents can be used in combination. The solvent can be mixed with a liquid that cannot dissolved in a microcapsule dispersion (provided that a mixture of the liquid with the solvent can be dissolved in the microcapsule dispersion).

The solvent is contained in the coating solution of the image-forming layer preferably in an amount of 5 to 95 wt. %, more preferably in an amount of 10 to 90 wt. %, and most preferably in an amount of 15 to 85 wt. %.

[Surface Active Agent]

The image-forming layer can contain a surface active agent. The surface active agent has a function of accelerating on press development (particularly at the stage of starting the development). The surface active agent has another function of improving the coated surface condition. The surface active agent is classified into a nonionic surface active agent, an anionic surface active agent, a cationic surface active agent, an amphoteric surface active agent and a fluorinated surface active agent.

Examples of the nonionic surface active agents include polyoxyalkylene alkyl ethers, polyoxyalkylene alkylphenyl ethers, polyoxyalkylene polystyrylphenyl ethers, polyoxyalkylene polyoxypropylene alkyl ethers, partial esters of glycerin with fatty acids, partial esters of sorbitan with fatty acids, partial esters of pentaerythritol with fatty acids, monoesters of propylene glycol with fatty acids, partial esters of sucrose with fatty acids, partial esters of polyoxyalkylene sorbitan with fatty acids, partial esters of polyoxyalkylene sorbitol with fatty acids, esters of polyethylene glycol with fatty acids, partial esters of polyglycerin with fatty acids, caster oils reacted with polyoxyalkylene, partial esters of polyoxyalkylene glycerin with fatty acids, aliphatic diethanolamides, N,N-bis(2-hydroxyalkyl)amines, polyoxyalkylene alkylamines, esters of triethanolamine with fatty acids, trialkylamine oxides, polyethylene glycol and ethylene glycol/propylene glycol copolymer. The above-mentioned polyoxyalkylene preferably is polyoxymethylene, polyoxyethylene, polyoxypropylene or polyoxybutylene.

Examples of the anionic surface active agents include salts of fatty acids, abietate salts, hydroxyalkanesulfonate salts, alkanesulfonate salts, salts of dialkylsulfosuccinate esters, normal alkylbenzenesulfonate salts, branched alkylbenzenesulfonate salts, alkylnaphthalenesulfonate salts, alkylphenoxypolyoxyalkylenepropylsulfonate salts, salts of polyoxyalkylene alkyl sulfophenyl ethers, sodium salts of N-methyl-N-oleiltaurine, disodium salts of N-alkylsulfosuccinic monoamides, petroleum sulfonate salts, beef tallow sulfate salts, salts of sulfate esters of alkyl esters of fatty acids, salts of alkyl sulfates, salts of sulfate esters of polyoxyalkylene alkyl ethers, salts of sulfate esters of monoglyceride esters of fatty acids, salts of sulfate esters of polyoxyalkylene alkylphenyl ethers, salts of sulfate esters of polyoxyalkylene styrylphenyl ethers, salts of alkyl phosphate, salts of phosphate esters of polyoxyalkylene alkyl ethers, salts of phosphate esters of polyoxyalkylene alkylphenyl ethers, partial saponification products of styrene/maleic anhydride copolymer, partial saponification products of olefin/maleic anhydride copolymer and condensates of naphthalenesulfonate salts with formalin. The above-mentioned polyoxyalkylene preferably is polyoxymethylene, polyoxyethylene, polyoxypropylene or polyoxybutylene.

Examples of the cationic surface active agents include alkyl amine salts, quarternary ammonium salts, polyoxyalkylenealkylamine salts, polyethylenepolyamine derivatives.

Examples of the amphoteric surface active agents include carboxybetaines, aminocarboxylic acids, sulfobetaines, aminosulfonate esters and imidazolines.

The fluorinated surface active agents include anionic agents (such as perfluoroalkylcarboxylate salts, perfluoroalkylsulfonate salts, perfluoroalkylphosphonate salts), cationic agents (such as perfulouroalkyl-trimethylamimonium salts), (such as perfluoroalkylamine oxides, ethylene oxide additives of perfluoroalkyls, oligomers having perfluoroalkyl group and oleophilic group, a urethane having perfluoroalkyl group and oleophilic group). The fluorinated surface active agents are described in Japanese Patent Provisional Publication Nos. 60(1985)-168144, 62(1977)-170950, 62(1977)-226143.

Two or more surface active agents can be used in combination.

The surface active agent is contained in the image-forming layer preferably in an amount of 0.001 to 10 wt. %, and more preferably in an amount of 0.01 to 5 wt. % based on the total solid contents of the image-forming layer.

[Coloring Agent]

The image-forming layer can contain a coloring agent to confirm an image formed after development. The coloring agent preferably is a dye having a large absorption within the visible wavelength region.

Examples of the dyes include Oil Yellow #101, Oil Yellow #103, Oil Pink #312, Oil Green BG, Oil Blue BOS, Oil Blue #603, Oil Black BS, Oil Black T-505 (which are available form Orient Chemical Industries, Ltd.), Victoria Pure Blue, Crystal Violet (C.I.: 42,555), Methyl Violet (C.I.: 42,535), Ethyl Violet, Rhodamine B (C.I.: 145,170B), Malachite Green (C.I.: 42,000), Methylene Blue (C.I.: 52,015). The dyes used as the coloring agents are described in Japanese Patent Provisional Publication No. 62 (1987)-293247.

The coloring agent is contained in the image-forming layer preferably in an amount of 0.01 to 10 wt. % based on the total solid contents of the image-forming layer.

[Printing-Out Agent]

The image forming layer can contain a printing-out agent to confirm an image formed after exposure before development. The printing-out agent preferably is a compound that can cause color change with an acid or a radical. The printing-out agent preferably is a diphenylmethane dye, a triphenylmethane dye, a thiazine dye, an oxazine dye, a xanthene dye, an anthraquinone dye, an iminoquinone dye, an azo dye and a azomethine dye.

Examples of the dyes used as the printing-out agents include Brilliant Green, Ethyl Violet, Methyl Green, Crystal Violet, Basic Fuchsine, Methyl Violet 2B, Quinaldine Red, Rose Bengal, Metanil Yellow, Thymolsulfonphthalein, Xylenol Blue, Methyl Orange, Paramethyl ed, Congo Red, Benzopurpurin 4B, α-Naphthyl Red, Nile Blue 2B, Nile Blue A, Methyl Violet, Malachite Green, Para Fuchsine, Victoria Pure Blue BOH (Hodogaya Chemical Co., Ltd.), Oil Blue #603 (Orient Chemical Industries, Ltd.), Oil Pink #312 (Orient Chemical Industries, Ltd.), Oil Red 5B (Orient Chemical Industries), Oil Scarlet #308 (Orient Chemical Industries, Ltd.), Oil Red OG (Orient Chemical Industries, Ltd.), Oil Red RR (Orient Chemical Industries, Ltd.), Oil Green #502 (Orient Chemical Industries, Ltd.), Spiron Red BEH Special (Hodogaya Chemical Co., Ltd.), m-Cresol Purple, Cresol Red, Rhodamine B, Rhodamine 6G, Sulfo Rhodamine B, Auramine, Leuco Crystal Violet, Pargascript Blue SRB (Ciba), Crystal Violet Lactone, Malachite Green Lactone, Benzoyl Leuco Methylene Blue.

Examples of the compounds used as the printing-out agents include 4-p-diethylaminophenyliminonaphthoquinone, 2-carboxyanilino-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone, 1-β-naphthyl-4-p-diethylaminophenylimino-5-pyrazolone, p,p',p"-hexamethyltriaminotriphenylmethane (Leuco Crystal Violet), 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-xylidionofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylfluoran, 3-(N,N-diethylamino)-7,8-benzofluoran, 3-(N,N-dibutylamino)-6-methyl-7-xylidinofluoran, 3-piperidino-6-methyl-7-anilinofluoran, 3-pyloridio-6-methyl-7-anilinofluoran, 3,3-bis(1-ethyl-2-methylindol-3-yl)phthalide, 3,3-bis(1-butyl-2-metylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide; 3-(4-diethylaminophenyl)-3-(1-ethyl-2-methylindol-3-yl)phthalide.

The printing-out agent is contained in the image-forming layer preferably in an amount of 0.01 to 10 wt. % based on the total solid contents of the image-forming layer.

[Polymerization Inhibitor]

The image-forming layer can contain a small amount of a polymerization inhibitor to inhibit polymerization after preparing a presensitized lithographic plate and before using the presensitized lithographic plate.

Examples of the polymerization inhibitors include hydroquinone, p-methoxyphenol, di-t-butyl-p-cresol, pyrogarol, t-butylcatechol, benzoquinone, 4,4'-thiobis(3-methyl-6-t-butylphenol), 2,2'-methylenebis(4-methyl-6-t-butylphenol), aluminum salt of N-nitroso-N-phenylhydroxylamine.

The polymerization inhibitor is contained in the image-forming layer preferably in an amount of 0.01 to 5 wt. % based on the total solid contents of the image-forming layer.

[Higher Fatty Acid and Amide Thereof]

The image-forming layer can contain a higher fatty acid or an amide thereof to inhibit influence of oxygen in the air to polymerization reaction. Oxygen has a function of inhibiting the polymerization reaction. The higher fatty acid or the amide thereof tends to move to the surface of the image-forming layer (interface between the layer and the air) while the image forming layer is dried after coating the image-forming layer.

The higher fatty acid or the amide thereof is contained in the image-forming layer preferably in an amount of 0.1 to 10 wt. % based on the total solid contents of the image-forming layer.

[Plasticizer]

The image-forming layer can contain a plasticizer to improve on press development.

Examples of the plasticizers include phthalate esters (e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate), glycol esters (e.g., dimethyl glycol phthalate, ethylphthalyl ethyl glycolate, methylphthalyl ethyl glycolate, butylphhalyl butyl glycolate, triethylene glycol dicaprylate), phosphate esters (e.g., tricresyl phosphate, triphenyl phosphate), esters of dibasic fatty acids (e.g., diisobutyl adipate, dioctyl adipate, dimethyl sebacate, dibutyl sebacate, dioctyl azelate, dibutyl maleate), polyglycidyl methacrylate, triethyl citrate, glycerin triacetate, butyl laurate.

The plasticizer is contained in the image-forming layer preferably in an amount of not more than 30 wt. % based on the total solid contents of the image-forming layer.

[Inorganic Particles]

The image-forming layer can contain inorganic particles to improve the strength of the hardened membrane within the image area and to improve on press development within the non-image area.

The inorganic materials of the particles include silica, alumina, magnesium oxide, titanium dioxide, magnesium carbonate and a mixture thereof. Commercially available particles such as a colloidal silica dispersion can be used as the inorganic particles.

The inorganic particles have an average particle size preferably in the range of 5 nm to 10 μm, and more preferably in the range of 0.5 to 3 μm. The average particle size is adjusted to disperse the particles in the image-forming layer uniformly and stably. The uniformly and stably dispersed particles can enhance the strength of the hardened membrane within the image area, and can remove the non-image area easily at on press development.

The inorganic particles are contained in the image-forming layer preferably in an amount of not more than 20 wt. %, and more preferably in an amount of not more than 10 wt. % based on the total solid contents of the image-forming layer.

[Organic Particles]

The image-forming layer can contain organic particles (such as calcium alginate particles) in place of the above-mentioned inorganic particles.

[Low Molecular Weight Hydrophilic Compound]

The image-forming layer can contain a low molecular weight hydrophilic compound to improve on press development. The low molecular weight hydrophilic compound preferably is a water-soluble organic compound.

Examples of the water-soluble organic compounds include glycols (e.g., ethylene glycol, diethylene glycol, triethylene glycol, propylene glycol, dipropylene glycol, tripropylene glycol), ethers thereof, esters thereof, polyhydric alcohols (e.g., glycerin, pentaerythritol), amines (e.g., triethanolamine, diethanolamine, monoethanolamine), salts thereof, sulfonic acids (e.g., toluenesulfonic acid, benzensulfonic acid), salts thereof, phosphonic acids (e.g., phenylphosphonic acid), salts thereof, carboxylic acids (e.g., tartaric acid, oxalic acid, citric acid, malic acid, lactic acid, gluconic acid, amino acid), salts thereof.

[Formation of Image-Forming Layer]

The image-forming layer can be formed by dissolving, dispersing or emulsifying the contents of the layer in an solvent to prepare a coating solution and coating the prepared solution.

Examples of the solvents include halogenated hydrocarbons (e.g., ethylene chloride), ketones (e.g., cyclohexanone, methyl ethyl ketones), alcohols (e.g., methanol, ethanol, propanol, 1-methoxy-2-propanol), ethers (e.g., dimethoxyethane, ethylene glycol monomethyl ether), esters (e.g., 2-methoxyetyl acetate, 1-methoxy-2-propyl acetate, methyl lactate, ethyl lactate), amides (e.g., N,N-dimethylacetamide, dimethylformamide), tetramethylurea, N-methylpyrrolidone, dimethyl sulfoxide, sulfolane, γ-butyrolactone, toluene and water.

The solid content in the coating solution is preferably in the range of 1 to 50 wt. %.

The image-forming layer can be formed by coating two or more coating solutions, which can be different from each other.

After drying the image-forming layer, the coated amount (solid content) of the image-forming layer is preferably in the range of 0.3 to 3.0 g/$m^2$. The coating amount is adjusted to control the sensitivity and the characteristics of the formed layer.

The image-forming layer can be coated according to a bar coating method, a rotating coating method, a spray coating method, a curtain coating method, a dip coating method, an air-knife coating method, a blade coating method or a roll coating method.

[Hydrophilic Support]

The hydrophilic support preferably is a dimensionally stable film, plate or sheet.

Examples of the supports include paper, a paper laminated with a polymer (e.g., polyethylene, polypropylene, polystyrene) film, a metal (e.g., aluminum, zinc, copper) plate, a polymer (e.g., cellulose diacetate, cellulose triacetate, cellulose propionate, cellulose butyrate, cellulose acetate propionate, cellulose acetate butyrate, cellulose nitrate, polyethylene terephthalate, polyethylene, polystyrene, polypropylene, polycarbonate, polyvinyl acetal) film, a paper laminated with a metal, a polymer film laminated with a metal, a paper subjected to vapor deposition of a metal, a polymer film subjected to vapor deposition of a metal. A polymer film and a metal plate are preferred, and a polyester film and an aluminum plate are more preferred, and an aluminum plate is most preferred.

The aluminum plate subjected to anodic oxidation is particularly preferred.

The aluminum plate is a plate of pure aluminum or an alloy plate comprising the main component of aluminum and a little amount of other metals. Examples of the other metals include Si, Fe, Mn, Co, Mg, Cr, Zn, Bi, Ni and Ti. The amount of those metals is preferably of not more than 10 wt. %. It is technically difficult to prepare a pure aluminum in smelting. Therefore, an aluminum alloy plate comprising a little amount of other metals has been used in practice.

The aluminum plate has a thickness preferably of 0.1 to 0.6 mm, more preferably of 0.15 to 0.4 mm, and most preferably of 0.2 to 0.3 mm.

The surface of the aluminum plate is preferably subjected to a surface treatment such as a roughing treatment and an anodic oxidation treatment. The surface treatment has a function of making the surface more hydrophilic. The surface treatment has another function of improving adhesion between the support and the image-forming layer.

The aluminum plate can be subjected to a defatting treatment before conducting the surface treatment. The defatting treatment is conducted by using a surface active agent, an organic solvent or an aqueous alkaline solution to remove machine oil from the surface.

The roughing treatments include a mechanical roughing treatment, an electrochemical roughing treatment (dissolving the surface electrochemically to form a rough surface) and a chemical roughing treatment (dissolving the surface chemically to form a rough surface).

Examples of the mechanical roughing treatment include a ball grinding method, a brush grinding method, a blast grinding method and a buff grinding method.

The electrochemical roughing treatment is, for example, a procedure in which direct or alternative current is applied to the plate in an electrolysis solution containing acid such as hydrochloric acid or nitric acid. The electrochemical roughing treatment can use a mixed acid, as is described in Japanese Patent Provisional Publication No. 54(1979)-63902.

After the roughing treatment, the aluminum plate can be subjected to alkali etching treatment. The alkali etching liquid preferably is an aqueous solution of potassium hydroxide or sodium hydroxide. After the alkali etching treatment, a neutralizing treatment can be conducted. An anodic oxidation treatment is preferably conducted to improve the abrasion resistance of the support after the neutralizing treatment.

An electrolyte is used in the anodic oxidation treatment to form a porous oxide film. Examples of the electrolytes include sulfuric acid, hydrochloric acid, oxalic acid, chromic acid, and a mixture thereof.

The anodic oxidation treatment is generally carried out under the specific conditions. For example, the concentration of the electrolytic solution is in the range of 1 to 80 wt. %, the temperature of the solution is in the range of 5 to 70° C., the electric current density is in the range of 5 to 60 A/dm$^2$, the voltage is in the range of 1 to 100 V, and the time for electrolysis is in the range of 10 seconds to 5 minutes. The oxide film formed by the anodic oxidation has a thickness preferably of 1.0 to 5.0 g/m$^2$, and more preferably of 1.5 to 4.0 g/m$^2$. The thickness is so adjusted to improve the abrasion resistance.

After the anodic oxidation treatment, the aluminum plate can be further subjected to a hydrophilic treatment. The hydrophilic treatment preferably is an alkali metal silicate treatment (described in U.S. Patent Publication Nos. 2,714, 066, 3,181,461, 3,280,734 and 3,902,734). In the alkali metal silicate treatment, the aluminum plate is immersed or subjected to electrolysis in an aqueous solution of alkali metal silicate (e.g., sodium silicate). The hydrophilic treatment can be also conducted by using a potassium fluorozirconate (described in Japanese Patent Publication No. 36(1961)-22063) and polyvinyl phosphonate (described in U.S. Pat. Nos. 3,276,868, 4,153,461, 4,689,272).

The support has a central surface roughness (Ra) preferably in the range of 0.10 to 1.2 μm.

The support has a color density preferably in the range of 0.15 to 0.65, which is measured as a reflection density.

[Backing Layer]

A backing layer can be formed on a back side of the support. The backing layer is preferably formed by coating after subjecting the support to a surface treatment or forming an undercoating layer.

The backing layer preferably is a coating layer containing an organic polymer (described in Japanese Patent Provisional Publication No. 5(1993)-45885). The backing layer can be a coating layer comprising a metal oxide, which can be formed by hydrolysis or condensation polymerization of an organic or inorganic metallic compound (described in Japanese Patent Provisional Publication No. 6(1994)-35174). The organic metallic compound preferably is an alkoxy silicon compound such as $Si(OCH_3)_4$, $Si(OC_2H_5)_4$, $Si(OC_3H_7)_4$, $Si(OC_4H_9)_4$.

[Undercoating Layer]

An undercoating layer can be formed between the support and the image-forming layer or the backing layer.

The undercoating layer can function as a thermal barrier layer. The thermal barrier layer can prevent heat (formed by converting infrared light) diffusing from the image-forming layer to the support. Therefore, the thermal barrier layer has a function of improving the thermal efficiency of the presensitized lithographic plate. In other words, the sensitivity of the presensitized lithographic plate can be improved by the thermal barrier layer as the undercoating layer.

The undercoating layer can have another function of improving on press development in which the image-forming layer within the unexposed area is removed from the support.

The undercoating layer can be formed by using a silane coupling agent or a phosphoric compound having an ethylenically unsaturated double bond that can be reacted to cause an addition polymerization (described in Japanese Patent Provisional Publication No. 10(1998)-282679).

The coating amount (solid contents) of the under-coating layer is preferably in the range of 0.1 to 100 mg/m$^2$, and more preferably in the range of 3 to 30 mg/m$^2$.

[Protective Layer]

A protective layer can be formed on the image-forming layer. The protective layer can have a function of protecting the surface of the image-forming layer from scratch. The protective layer can have another function of preventing oxygen from permeating the image-forming layer. The protective layer can further has a function of protecting the image-forming layer from abrasion when the presensitized lithographic plate is scanned with a laser bean of high illuminance.

The presensitized lithographic plate is exposed to infrared light usually in the air, which contains oxygen, which has a function of inhibiting a polymerization reaction. The protective layer preferably has a function of preventing oxygen or a low molecular weight basic substance from permeating the image-forming layer. The protective layer preferably has a low permeability to a substance of a low molecular weight. The protective layer further preferably is transparent to infrared light. The protective layer furthermore has a good adhesion to the image-forming layer. Moreover, the protective layer preferably is easily removed at on press development. The protective layer is described in U.S. Pat. No. 3,458,311 and Japanese Patent Provisional Publication No. 55(1980)-49729.

The protective layer preferably comprises a water-soluble polymer that can be crystallized. Examples of the water-soluble polymers include polyvinyl alcohol, polyvinyl pyrrolidone, acidic cellulose derivatives, gelatin, gum arabic and polyacrylic acid. Polyvinyl alcohol (PVA) is particularly preferred. Polyvinyl alcohol has an excellent function of preventing oxygen from permeating the image-forming layer. Polyvinyl alcohol can be easily removed at on press development. The functions are given by non-substituted vinyl alcohol units contained in the polyvinyl alcohol. Alcoholic hydroxyl groups in polyvinyl alcohol can be substituted with an ester bond, an ether bond or an acetal bond so long as a considerable amount of the alcoholic hydroxyl remain in polyvinyl alcohol. Polyvinyl alcohol can be a copolymer of vinyl alcohol units with the other repeating units.

Polyvinyl alcohol has a saponification degree preferably in the range of 71 to 100%. Polyvinyl alcohol has a polymerization degree preferably in the range of 300 to 2,400. The overcoating layer can be formed by using a commercially available polyvinyl alcohol (e.g., PVA-105, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, Kuraray Co., Ltd.).

Polyvinyl alcohol having a high saponification degree (in which the ratio of the non-substituted vinyl alcohol units is high) or a thick protective layer has an excellent function of preventing oxygen from permeating the image-forming layer to improve the sensitivity. However, an extremely low permeability to oxygen is not necessary. Permeability to oxygen at 25° C. under ordinary atmosphere (cc/m$^2$ day) is preferably in the range of 0.2 to 20.

The protective layer can contain a polyhydric alcohol (e.g., glycerin, dipropylene glycol) to improve flexibility. The protective layer contains the polyhydric alcohol preferably in an amount of 1 to 10 wt. % based on the amount of the water-soluble polymer.

The protective layer can contain an anionic surface active agent (e.g., sodium alkylsulfate, sodium alkylsulfonate), an amphoteric surface active agent (e.g., a salt of alkyl aminocarboxylate, a salt of alkylaminodicarboxylate) or a nonionic surface active agent (e.g., polyoxyethylene alkylphenyl ether). The protective layer contain the surface active agent preferably in an amount of 1 to 10 wt. % based on the amount of the water-soluble polymer.

The protective layer has a thickness preferably in the range of 0.1 to 5 μm, and more preferably in the range of 0.2 to 2 μm.

The protective layer comprising a water-soluble polymer, which is a hydrophilic layer tends to be peeled from the image-forming layer. If the protective layer is peeled from the image-forming layer, the image-forming layer is not protected from oxygen. The protective layer can further contain an acrylic emulsion or a water insoluble polymer (such as vinyl pyrrolidone-vinyl acetate copolymer) in an amount of 20 to 60 wt. % based on the water-soluble polymer to improve the adhesion between the protective layer and the image-forming layer, as is described in Japanese Patent Provisional Publication No. 49(1974)-70702 and British Patent Publication No. 1,303,578. A method of coating a protective layer is described in U.S. Pat. No. 3,458,311 and Japanese Patent Provisional Publication No. 55(1980)-49729.

The protective layer can function as a color filter layer. For example, the protective layer can contain a coloring agent (preferably a water-soluble dye) that is transparent to infrared light (which is used in image formation) and absorbs the other light. The coloring agent has a function of decreasing sensitivity to safe light without decreasing sensitivity to infrared light.

[Step of Imagewise Exposure]

The presensitized lithographic plate is imagewise exposed to infrared light. The presensitized lithographic plate is preferably scanned with infrared laser beam.

The infrared light has a wavelength preferably in the range of 760 t 1,200 nm.

The light source of the infrared laser bean preferably is a solid laser or a semi-conductor laser. Power of the infrared laser is preferably not less than 100 mW. A multi-beam laser device can be used to shorten the exposure time.

The exposure time for one pixel is preferably shorter than 20 micro seconds. The exposure energy is preferably in the range of 10 to 300 $mJ/cm^2$.

The presensitized lithographic plate can be image-wise exposed to infrared light while mounting the lithographic plate on a cylinder of a printing press.

The light energy of infrared light is transferred from the infrared absorbing agent to the polymerization initiator. In the case that the infrared absorbing agent functions as an agent of converting light to heat, convert heat energy is transferred to the polymerization initiator, which functions as a thermal polymerization initiator. In the case that the infrared absorbing agent functions as an infrared sensitizing dye, light energy is converted to a chemical energy, which is transferred to the polymerization initiator, which functions as a photo-polymerization initiator. The infrared absorbing agent can have two or more functions described above.

The polymerization initiator initiates polymerization reaction of a polymerizable compound within the exposed area.

[Step of on Press Development]

After exposing the presensitized lithographic plate, the image-forming layer is removed within the unexposed area while mounting the lithographic plate on a cylinder of a printing press.

At the step of on press development, dampening water and oily ink are supplied to the lithographic plate.

The image-forming layer within the unexposed area can be removed by a chemical function, a mechanical force or a combination thereof. The chemical function is given by water (in dampening water) or oil (in oily ink). Namely, the image-forming layer is dissolved or dispersed in water or oil. The mechanical force is given by cylinders of the printing press.

After the image-forming layer is removed within the unexposed area, a hydrophilic surface of the support is exposed, which forms a hydrophilic (non-image) area. On the other hand, the image-forming layer remains on the hydrophilic support within the exposed area, which corresponds to a hydrophobic (image) area.

[Step of Printing]

After the on press development, an image can be printed with the lithographic plate while mounting the lithographic plate on the cylinder of the printing press. According, the step of on press development and the step of printing can be continuously conducted.

In the printing step, dampening water and oily ink is supplied to the lithographic plate. The dampening water is attached to the hydrophilic non-image area (unexposed to infrared light), and the oily ink is attached to the hydrophobic image area (exposed to infrared light). The oily ink is preferably first supplied to the lithographic plate to prevent contamination of dampening water from contents of the image-forming layer within the unexposed area.

As is described above, the lithographic plate is developed, and printing process is conducted while mounting the lithographic plate on the cylinder of the printing press.

EXAMPLE 1

(Preparation of Aluminum Support)

Melt of JIS-A-1050 alloy containing Al (99.5 wt. % or more), Fe (0.30 wt. %), Si (0.10 wt. %), Ti (0.02 wt. %), Cu (0.013 wt. %) and inevitable impurities (the rest) was cleaned and molded. For cleaning the melt, the melt was degassed to remove contaminating gases (such as hydrogen gas), and then filtrated through a ceramic tube filter. For molding the melt, the DC molding was carried out. The solidified molded metal was in the form of a plate having 500 mm thickness. The plate was planed off by 10 mm, and then subjected to uniforming treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler to improve the planeness.

The obtained plate was subjected to the following surface treatments, to form a support of lithographic printing plate.

The rolling oil was removed form the surface of the plate, The plate was subjected to oil-removing treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Next, the plate surface was subjected to roughing treatment (what is called sand roughing) to improve adhesion between the support and the image-forming layer and to make the non-imaging area keep enough water. In an aqueous solution containing nitric-acid (1 wt. %) and aluminum nitrate (0.5 wt. %) at 45° C., the plate was subjected to electrolytic sand roughing treatment. In the treatment, while an aluminum web was left in the solution, an indirect power cell supplied an alternative current of alternative wave under the conditions of the electric current density of 20 A/$dm^2$, the duty ratio of 1:1 and the anodic electricity of 240 C/$dm^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, for improving the abrasion resistance, the chemical resistance and the water retainment, an oxide film was formed on the support by anodic oxidation. In the film formation, while an aluminum web was left in a 20% aqueous solution of sulfuric acid at 35° C., an indirect power cell supplied a direct current of 14 A/$dm^2$ to electrolyze for forming an oxide film of 2.5 g/$m^2$.

The plate was subjected to silicate treatment to make the non-imaging area more hydrophilic. In the treatment, the plate was made contact with an aluminum web for 15 seconds in a 1.5 wt. % aqueous solution of sodium silicate (No. 3) at 70° C., and washed with water. The amount of attached Si was 10 mg/$M^2$. The thus-prepared support had a central surface roughness (Ra) of 0.25 μm.

(Preparation of Microcapsule Dispersion)

In 17 g of ethyl acetate, 9.5 g of an adduct of trimethylolpropane with xylylene diisocianate (Takenate D-110N, Mistui-Takeda Chemicals, Inc.), 0.5 g of 2-methacryloyloxyethyl isocyanate, 3.15 g of pentaerythritol triacrylate, 0.35 g of the infrared absorbing agent (4) and 0.1 g of a surface-active agent (Pionine A-41C, Takemoto oil & fat Co., Ltd.) were dissolved to prepare an oil phase.

Independently, 40 g of 4 wt. % aqueous solution of polyvinyl alcohol (PVA-205, Kuraray Co., Ltd.) was prepared as an aqueous phase.

The oil and aqueous phases were mixed and emulsified with a homogenizer at 12,000 rpm for 10 minutes. To the obtained emulsion, 25 g of distilled water was added. The mixture was stirred at room temperature for 30 minutes, and further stirred at 40° C. for 3 hours to prepare microcapsule dispersion. The microcapsule dispersion was diluted with distilled water to adjust the solid content of 20 wt. %. The average particle size of the microcapsules was 0.32 μm.

(Formation of Image-Forming Layer)

The following coating solution was coated on the aluminum support by using a bar coater, and dried at 70° C. for 60 seconds in an oven to form an image-forming layer in the dry coating amount of 0.8 g/$m^2$. Thus, a presensitized lithographic plate was produced.

| Coating solution for image-forming layer | |
|---|---|
| Water | 100 g |
| The microcapsule dispersion (solid content) | 5 g |

-continued

| Coating solution for image-forming layer | |
|---|---|
| The polymerization initiator (1) | 0.5 g |
| The following fluorine-containing surface-active agent | 0.2 g |

(Polymerization initiator (1))

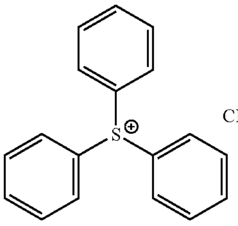

$CH_3—O—SO_3^{\ominus}$ (Fluorine-containing surface-active agent)

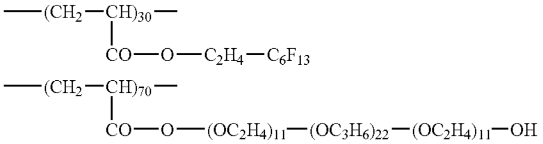

(Process)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 17 W, the outer drum rotation was 133 rpm, and the resolution was 2,400 dpi. The exposed image contains fine-line chart.

(Evaluation of on Press Development)

Without subjecting to the developing treatment, the exposed plate was immediately installed on the cylinder of printer (Heidelberg SOR-M). As the dampening water, a mixture of etching solution (EU-3, Fuji Photo Film Co., Ltd.)/water/iso-propyl alcohol [1/89/10 by volume]) was supplied. While black ink (TRANS-G(N), Dainippon Ink & Chemicals, Inc.) was further supplied, 100 sheets of paper were printed at the rate of 6,000 sheets per hour.

When the unexposed area of the image-forming layer was removed to complete the press development on the printing press, the ink on the unexposed area was no longer transferred onto the paper. How many sheets of paper were printed until the press development was completed was counted, and thereby the suitability for on press development was evaluated.

The results are set forth in Table 1.

(Reproducibility of Fine-Line Chart)

After 100 sheets of paper were printed, it was confirmed that the ink on the unexposed area was no longer transferred onto the paper. Then, 500 sheets of paper were further printed. The fine-line charts (fine lines of 10, 12, 14, 16, 18, 20, 25, 30, 35, 40, 60, 80, 100 and 200 μm were exposed) printed on the 600 sheets of paper in total were then observed through a 25-power loupe to find how thin lines were reproduced without breaks, and thereby the reproducibility of fine lines was evaluated. The thinner lines were reproduced, the higher sensitivity the presensitized plate had.

The results are set forth in Table 1.

(Plate Wear)

After the above printing for evaluating the fine-line reproducibility was conducted, the printing was furthermore continued. According as the sheets of printed paper increased, the image-forming layer gradually wore down and less received ink so that the density of ink on the printed paper was lowered. It was counted how many sheets of paper were printed until the ink density (reflection density) faded by 0.1 based on the beginning of printing, and thereby the plate wear was evaluated.

The results are set forth in Table 1.

EXAMPLE 2

The procedure of Example 1 was repeated except that the polymerization initiator (3) was used in place of the polymerization initiator (1) to produce a presensitized lithographic printing plate. The produced plate was evaluated in the same manner as in Example 1. The results are set forth in Table 1.

(Polymerization Initiator (3))

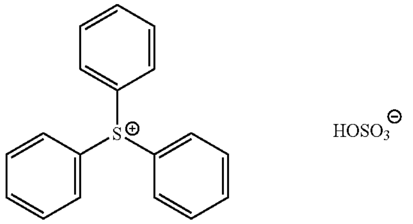

EXAMPLE 3

The procedure of Example 1 was repeated except that the polymerization initiator (60) was used in place of the polymerization initiator (1) to produce a presensitized lithographic printing plate. The produced plate was evaluated in the same manner as in Example 1. The results are set forth in Table 1.

(Polymerization Initiator (60))

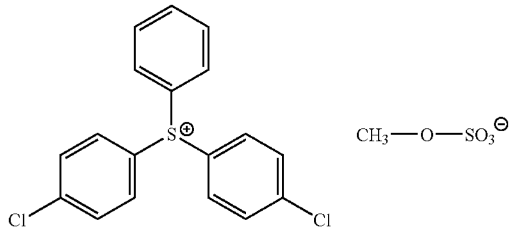

COMPARISON EXAMPLE 1

The procedure of Example 1 was repeated except that the polymerization initiator (X1) was used in place of the polymerization initiator (1) to produce a presensitized lithographic printing plate. The produced plate was evaluated in the same manner as in Example 1. The results are set forth in Table 1.

(Polymerization Initiator (X1))

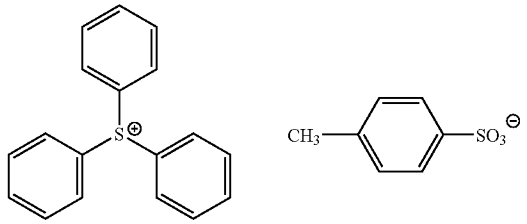

COMPARISON EXAMPLE 2

The procedure of Example 1 was repeated except that the polymerization initiator (X2) was used in place of the polymerization initiator (1) to produce a presensitized lithographic printing plate. The produced plate was evaluated in the same manner as in Example 1. The results are set forth in Table 1.

(Polymerization Initiator (X2))

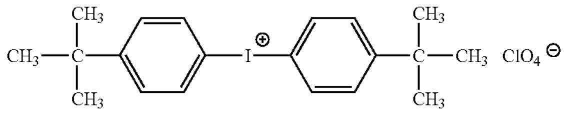

TABLE 1

| Presensitized plate | Polymerization initiator | Suitability for on press development | Fine-line reproducibility | Plate wear |
|---|---|---|---|---|
| Example 1 | (1) | 20 sheets | 20 µm | 5,500 sheets |
| Example 2 | (3) | 20 sheets | 20 µm | 4,500 sheets |
| Example 3 | (60) | 20 sheets | 20 µm | 4,800 sheets |
| Comp. Ex. 1 | (X1) | 20 sheets | 30 µm | 2,300 sheets |
| Comp. Ex. 2 | (X2) | 20 sheets | 30 µm | 2,000 sheets |

EXAMPLE 4

(Formation of Image-Forming Layer)

The following coating solution was coated on the aluminum support prepared in Example 1 by using a bar coater, and dried at 100° C. for 60 seconds in an oven to form an image-forming layer in the dry coating amount of 1.0 g/m$^2$. Thus, a presensitized lithographic plate was produced.

| Coating solution for image-forming layer | |
|---|---|
| Infrared absorbing agent (3) | 0.05 g |
| The polymerization initiator (1) | 0.2 g |
| The following binder polymer (average molecular weight: 80,000) | 0.5 g |
| Triacrylate denatured with ethylene oxide isocyanulate (NK Ester M-315, Shin Nakamura Chemical Industries, Ltd.) | 1.0 g |
| The fluorine-containing surface-active agent used in Example 1 | 0.1 g |

-continued

| Coating solution for image-forming layer | |
|---|---|
| Water | 100 g |
| Methyl ethyl ketone | 18.0 g |

(Binder polymer)

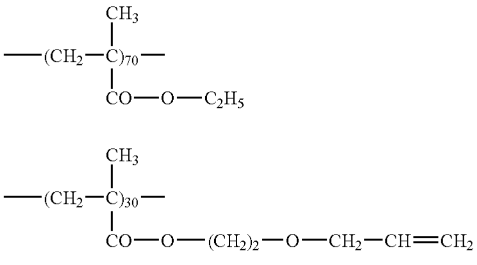

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

The processed lithographic plate was evaluated in the same manner as in Example 1. The results are set forth in Table 2.

EXAMPLE 5

The procedure of Example 4 was repeated except that the polymerization initiator (3) was used in place of the polymerization initiator (1) to produce a presensitized lithographic printing plate. The produced plate was evaluated in the same manner as in Example 1. The results are set forth in Table 2.

EXAMPLE 6

The procedure of Example 4 was repeated except that the polymerization initiator (60) was used in place of the polymerization initiator (1) to produce a presensitized lithographic printing plate. The produced plate was evaluated in the same manner as in Example 1. The results are set forth in Table 2.

COMPARISON EXAMPLE 3

The procedure of Example 4 was repeated except that the polymerization initiator (X1) was used in place of the polymerization initiator (1) to produce a presensitized lithographic printing plate. The produced plate was evaluated in the same manner as in Example 1. The results are set forth in Table 2.

COMPARISON EXAMPLE 4

The procedure of Example 4 was repeated except that the polymerization initiator (X2) was used in place of the polymerization initiator (1) to produce a presensitized lithographic printing plate. The produced plate was evaluated in the same manner as in Example 1. The results are set forth in Table 2.

TABLE 2

| Presensitized plate | Polymerization initiator | Suitability for on press development | Fine-line reproducibility | Plate wear |
|---|---|---|---|---|
| Example 4 | (1) | 40 sheets | 30 μm | 4,500 sheets |
| Example 5 | (3) | 42 sheets | 30 μm | 4,500 sheets |
| Example 6 | (60) | 41 sheets | 30 μm | 4,800 sheets |
| Comp. Ex. 3 | (X1) | 41 sheets | 40 μm | 2,300 sheets |
| Comp. Ex. 4 | (X2) | 43 sheets | 40 μm | 2,500 sheets |

EXAMPLE 7

(Formation of Image-Forming Layer)

The following coating solution was coated on the aluminum support prepared in Example 1 by using a bar coater, and dried at 70° C. for 60 seconds in an oven to form an image-forming layer in the dry coating amount of 0.8 g/$m^2$. Thus, a presensitized lithographic plate was produced.

| Coating solution for image-forming layer | |
|---|---|
| Water | 100 g |
| The microcapsule dispersion prepared in Example 1 (solid content) | 5 g |
| The homopolymer consisting of the repeating units (II-21) | 0.5 g |
| The fluorine-containing surface-active agent used in Example 1 | 0.2 g |

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 17 W, the outer drum rotation was 133 rpm, and the resolution was 2,400 dpi. The exposed image contains fine-line chart.

The processed lithographic plate was evaluated in the same manner as in Example 1. The results are set forth in Table 3.

EXAMPLE 8

The procedure of Example 7 was repeated except that the homopolymer consisting of the repeating units (II-9) was used in place of the homopolymer consisting of the repeating units (II-21) to produce a presensitized lithographic printing plate. The produced plate was evaluated in the same manner as in Example 1. The results are set forth in Table 3.

EXAMPLE 9

The procedure of Example 4 was repeated except that the homopolymer consisting of the repeating units (II-25) was used in place of the homopolymer consisting of the repeating units (II-21) to produce a presensitized lithographic printing plate. The produced plate was evaluated in the same manner as in Example 1. The results are set forth in Table 3.

TABLE 3

| Presensitized plate | Polymerization initiator | Suitability for on press development | Fine-line repro-ducibility | Plate wear |
|---|---|---|---|---|
| Example 7 | (II-21) | 20 sheets | 20 μm | 5,000 sheets |
| Example 8 | (II-9) | 20 sheets | 20 μm | 4,700 sheets |
| Example 9 | (II-25) | 20 sheets | 20 μm | 4,200 sheets |
| Comp. Ex. 1 | (X1) | 20 sheets | 30 μm | 2,300 sheets |
| Comp. Ex. 2 | (X2) | 20 sheets | 30 μm | 2,000 sheets |

EXAMPLE 10

(Formation of Image-Forming Layer)

The following coating solution was coated on the aluminum support prepared in Example 1 by using a bar coater, and dried at 100° C. for 60 seconds in an oven to form an image-forming layer in the dry coating amount of 1.0 g/$m^2$. Thus, a presensitized lithographic plate was produced.

| Coating solution for image-forming layer | |
|---|---|
| Infrared absorbing agent (3) | 0.05 g |
| The homopolymer consisting of the repeating units (II-1) | 0.2 g |
| The binder polymer used in Example 4 | 0.5 g |
| Triacrylate denatured with ethylene oxide isocyanulate (NK Ester M-315, Shin Nakamura Chemical Industries, Ltd.) | 1.0 g |
| The fluorine-containing surface-active agent used in Example 1 | 0.1 g |
| Methyl ethyl ketone | 18.0 g |

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

The processed lithographic plate was evaluated in the same manner as in Example 1. The results are set forth in Table 4.

EXAMPLE 11

The procedure of Example 10 was repeated except that the homopolymer consisting of the repeating units (II-3) was used in place of the homopolymer consisting of the repeating units (II-1) to produce a presensitized lithographic printing plate. The produced plate was evaluated in the same manner as in Example 1. The results are set forth in Table 4.

EXAMPLE 12

The procedure of Example 10 was repeated except that the homopolymer consisting of the repeating units (II-17) was used in place of the homopolymer consisting of the repeating units (II-1) to produce a presensitized lithographic printing plate. The produced plate was evaluated in the same manner as in Example 1. The results are set forth in Table 4.

EXAMPLE 13

The procedure of Example 10 was repeated except that the homopolymer consisting of the repeating units (II-21) was used in place of the homopolymer consisting of the repeating units (II-1) to produce a presensitized lithographic printing plate. The produced plate was evaluated in the same manner as in Example 1. The results are set forth in Table 4.

TABLE 4

| Presensitized plate | Polymerization initiator | Suitability for on press development | Fine-line repro-ducibility | Plate wear |
|---|---|---|---|---|
| Example 10 | (II-1) | 40 sheets | 30 μm | 5,200 sheets |
| Example 11 | (II-3) | 40 sheets | 30 μm | 4,700 sheets |
| Example 12 | (II-17) | 42 sheets | 30 μm | 4,600 sheets |
| Example 13 | (II-21) | 42 sheets | 30 μm | 4,600 sheets |
| Comp. Ex. 3 | (X1) | 41 sheets | 40 μm | 2,300 sheets |
| Comp. Ex. 4 | (X2) | 43 sheets | 40 μm | 2,500 sheets |

EXAMPLE 14

(Preparation of Aluminum Support)

An aluminum plate of JIS-A-1050 (thickness: 0.3 mm) was subjected to the following treatments (a) to (k) to prepare an aluminum support.

(a) Mechanical Roughing Treatment

The surface of the aluminum plate was subjected to a mechanical roughing treatment by using a rotating Nylon blush in the form of a roller while supplying a suspension of an abrasive (silica sand) having the specific gravity of 1.12 in water as a grinding slurry to the surface. The abrasive had the average particle size of 8 μm and the maximum particle size of 50 μm. The Nylon blush was made of 6.10 Nylon. The hair length of the blush was 50 mm, the hair diameter of the blush was 0.3 mm. The Nylon blush was formed by boring small holes on a stainless tube having the diameter of 300 mm, and planting the hair in the holes closely. Three rotating blushes were used. Two supporting rollers having the diameter of 200 mm were attached to the under part of the blush. The distance between the two supporting rollers was 300 mm. The supporting rollers press the brush roller to the aluminum plate under such a pressure that the difference in the load of the motor rotating the blush between before and after pressing the brush roller is 7 kW or more. The direction of the rotation of the blush is the direction of conveying the aluminum plate. The blush was rotated at 200 rpm.

(b) Alkali Etching Treatment

The aluminum plate was subjected to an etching treatment by spraying 26 wt. % aqueous solution of sodium hydroxide (containing aluminum ion in the amount of 6.5 wt. %) at 70° C. to the plate. The aluminum plate was partially (6 g/$m^2$) dissolved. The plate was washed by spraying well water to the plate.

(c) Desmut Treatment

The aluminum plate was subjected to a desmut treatment by spraying 1 wt. % aqueous solution of nitric acid (containing aluminum ion in the amount of 0.5 wt. %) at 30° C. to the plate. The plate was washed by splaying water to the plate. The solution of nitric acid was the waste solution after the electrochemical roughing treatment using a nitric acid solution.

(d) Electrochemical Roughing Treatment

The aluminum plate was subjected to an electrochemical roughing treatment. The treatment was conducted continuously. In the treatment, an alternative current of 60 Hz was used. The electrolysis was an aqueous solution of nitric acid of 10.5 g per liter containing aluminum ion of 5 g per liter at 50° C. In the alternative current wave, the time for changing the current from zero to the peak (TP) was 0.8 ms, and the DUTY ratio was 1:1. The alternative current wave has a trapezoid shape. The counter electrode was made of carbon. The supplemental anode was made of ferrite. The electrolytic cell was a radial cell type. The current density at the peak was 30 A/dm$^2$. The total electric amount was 220 C/dm$^2$ when the anode was aluminum plate. To the supplemental anode, 5% of the current was branched.

The plate was washed by spraying well water to the plate.

(e) Alkaline Etching Treatment

The aluminum plate was subjected to an alkaline etching treatment by spraying a solution containing 26 wt. % sodium hydroxide and 6.5 wt. % aluminum ion to the plate at 32° C. The aluminum plate was partially (0.20 g/m$^2$) dissolved. The smut of the plate comprising aluminum hydroxide formed at the electrochemical roughing treatment was removed from the plate. Further, the edge of the formed pit was partially dissolved to obtain a smooth edge.

The plate was washed by spraying well water to the plate. The etching amount was 3.5 g/m$^2$.

(f) Desmut Treatment

The aluminum plate was subjected to a desmut treatment by spraying 15 wt. % aqueous solution of nitric acid (containing aluminum ion in the amount of 4.5 wt. %) at 30° C. to the plate. The plate was washed by splaying water to the plate. The solution of nitric acid was the waste solution after the electrochemical roughing treatment using a nitric acid solution.

(g) Electrochemical Roughing Treatment

The aluminum plate was subjected to an electrochemical roughing treatment. The treatment was conducted continuously. In the treatment, an alternative current of 60 Hz was used. The electrolysis was an aqueous solution of hydrochloric acid of 7.5 g per liter containing aluminum ion of 5 g per liter at 35° C. The alternative current wave has a rectanglar shape. The counter electrode was made of carbon. The supplemental anode was made of ferrite. The electrolytic cell was a radial cell type. The current density at the peak was 25 A/dm$^2$. The total electric amount was 50 C/dm$^2$ when the anode was aluminum plate.

The plate was washed by spraying well water to the plate.

(h) Alkaline Etching Treatment

The aluminum plate was subjected to an alkaline etching treatment by spraying a solution containing 26 wt. % sodium hydroxide and 6.5 wt. % aluminum ion to the plate at 32° C. The aluminum plate was partially (0.10 g/m$^2$) dissolved. The smut of the plate comprising aluminum hydroxide formed at the electrochemical roughing treatment was removed from the plate. Further, the edge of the formed pit was partially dissolved to obtain a smooth edge.

The plate was washed by spraying well water to the plate.

(i) Desmut Treatment

The aluminum plate was subjected to a desmut treatment by spraying 25 wt. % aqueous solution of sulfric acid (containing aluminum ion in the amount of 0.5 wt. %) at 60° C. to the plate. The plate was washed by splaying water to the plate.

(j) Anodizing Treatment.

The aluminum plate was subjected to an anodizing treatment. The electrolyte was an aqueous solution of 170 g per liter of sulfuric acid containing 0.5 wt. % of aluminum ion. The reaction temperature was 43° C. The current density was about 30 A/dm$^2$. The formed oxide film was 2.7 g/m$^2$. The plate was washed by splaying water to the plate.

(k) Silicate Treatment

The aluminum plate was subjected to a silicate treatment by immersing the plate in 1.5 wt. % aqueous solution of sodium silicate (No. 3) at 30° C. for 10 seconds. The amount of the attached silicate was 3.6 mg/m$^2$. The plate was washed by splaying water to the plate.

(Formation of Image-Forming Layer)

The following coating solution was coated on the aluminum support by using a wire bar coater, and dried at 120° C. for 60 seconds to form an image-forming layer in the dry coating amount of 1.0 g/m$^2$. Thus, a presensitized lithographic plate was produced.

| Coating solution for image-forming layer | |
|---|---|
| Infrared absorbing agent (5) | 2 weight parts |
| The polymerization initiator (101) (solubility in water: 40 wt. % or more) | 10 weight parts |
| Dipentaerythrytol hexaacrylate (NK Ester A-DPH, Shin Nakamura Chemical Industries, Ltd.) | 55 weight parts |
| Polyvinyl acetal resin (Elex B BM-S, Sekisui Chemical Industries, Ltd.) | 37 weight parts |
| The fluorine-containing surface-active agent used in Example 1 | 6 weight parts |
| Methyl ethyl ketone | 900 weight parts |

(Polymerization initiator (101))

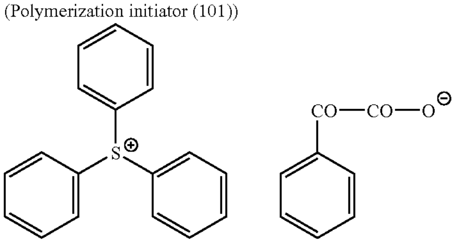

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 10.2 W, and the outer drum rotation was 150 rpm. The exposed image contains fine-line chart.

The processed lithographic plate was evaluated in the same manner as in Example 1. The results are set forth in Table 5.

EXAMPLE 15

(Preparation of Aluminum Support)

An aluminum plate of JIS-A-1050 (thickness: 0.3 mm) was subjected to the treatments (a) to (f), (j) and (k) conducted in Examples 14 to prepare an aluminum support. In other words, the aluminum support was prepared in the same manner as in Example 14, except that the treatments (g), (h) and (i) were not conducted.

(Process and Evaluation)

A presensitized lithographic plate was prepared and evaluated in the same manner as in Example 14, except that the above-prepared aluminum support was used. The results are set forth in Table 5.

EXAMPLE 16

(Preparation of Aluminum Support)

An aluminum plate of JIS-A-1050 (thickness: 0.3 mm) was subjected to the treatments (b) to (f), (j) and (k) conducted in Examples 14 to prepare an aluminum support. In other words, the aluminum support was prepared in the same manner as in Example 14, except that the treatments (a), (g), (h) and (i) were not conducted.

(Process and Evaluation)

A presensitized lithographic plate was prepared and evaluated in the same manner as in Example 14, except that the above-prepared aluminum support was used. The results are set forth in Table 5.

EXAMPLE 17

(Preparation of Aluminum Support)

An aluminum plate of JIS-A-1050 (thickness: 0.3 mm) was subjected to the treatments (b), (c), (g) to (k) conducted in Examples 14 to prepare an aluminum support. In other words, the aluminum support was prepared in the same manner as in Example 14, except that the treatments (a), (d), (e) and (f) were not conducted. Further, the total electric amount at the treatment (g) was changed to 450 C/dm$^2$.

(Process and Evaluation)

A presensitized lithographic plate was prepared and evaluated in the same manner as in Example 14, except that the above-prepared aluminum support was used. The results are set forth in Table 5.

EXAMPLE 18

(Preparation of Aluminum Support)

An aluminum plate of JIS-A-1050 (thickness: 0.3 mm) was subjected to the treatments (b), (c), (g) to (j) conducted in Examples 14 to prepare an aluminum support. In other words, the aluminum support was prepared in the same manner as in Example 14, except that the treatments (a), (d), (e), (f) and (k) were not conducted. Further, the total electric amount at the treatment (g) was changed to 450 C/dm$^2$. Further, the following undercoating treatment was conducted after the treatment (j).

(l) Undercoating Treatment

The aluminum plate was subjected to an undercoating treatment by coating the following coating solution on the plate. The coating amount in terms of phosphor was about 0.05 g/m$^2$. The coated layer was dried at 100° C. for 1 minute.

| Coating solution for undercoating layer | |
|---|---|
| Phenyl phosphonate | 2 weight parts |
| Methanol | 800 weight parts |
| Water | 50 weight parts |

(Process and Evaluation)

A presensitized lithographic plate was prepared and evaluated in the same manner as in Example 14, except that the above-prepared aluminum support was used. The results are set forth in Table 5.

COMPARISON EXAMPLES 5-9

The procedure of Examples 14-18 were repeated except that the polymerization initiator (X3) was used in place of the polymerization initiator (101) to produce a presensitized lithographic printing plate. The produced plate was evaluated in the same manner as in Example 1. The results are set forth in Table 5.

(Polymerization Initiator (X3))

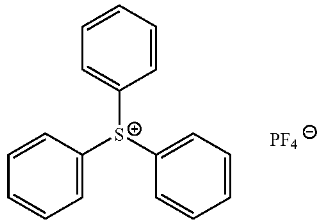

TABLE 5

| Presensitized plate | Treatment of aluminum support | Initiator | Suitability for on press development | Plate wear |
|---|---|---|---|---|
| Example 14 | a–k | (101) | 30 sheets | 8,000 sheets |
| Example 15 | a–f, j, k | (101) | 50 sheets | 12,000 sheets |
| Example 16 | b–f, j, k | (101) | 45 sheets | 10,000 sheets |
| Example 17 | b–c, g–k | (101) | 50 sheets | 12,600 sheets |
| Example 18 | b–c, g–j, l | (101) | 35 sheets | 7,000 sheets |
| Comp. Ex. 5 | a–k | (X3) | 80 sheets | 1,000 sheets |
| Comp. Ex. 6 | a–f, j, k | (X3) | 200 sheets | 2,000 sheets |
| Comp. Ex. 7 | b–f, j, k | (X3) | 150 sheets | 1,000 sheets |
| Comp. Ex. 8 | b–c, g–k | (X3) | 120 sheets | 1,000 sheets |
| Comp. Ex. 9 | b–c, g–j, l | (X3) | 100 sheets | 1,000 sheets |

EXAMPLE 19

(Formation of Protective Layer)

The following coating solution was coated on the image-forming layer prepared in Example 14 by using a coater, and dried at 125° C. for 75 seconds to form a protective layer in the dry coating amount of 0.5 g/m$^2$. Thus, a presensitized lithographic plate was produced.

| Coating solution for protective layer | |
|---|---|
| Polyvinyl alcohol (saponification degree: 98%, polymerization degree: 500) | 95 weight parts |
| Polyvinyl pyrrolidone/vinyl acetate copolymer | 4 weight parts |
| Nonionic surface active agent (EMALEX 710, Japan Emulsion Co., Ltd.) | 1 weight part |
| Pure water | 3,000 weight parts |

(Process and Evaluation)

The presensitized lithographic plate was evaluated in the same manner as in Example 1. The results are set forth in Table 6.

COMPARISON EXAMPLE 10

The procedures of Example 19 were repeated except that the polymerization initiator (X3) was used in place of the polymerization initiator (101) to produce a presensitized lithographic printing plate. The produced plate was evaluated in the same manner as in Example 1. The results are set forth in Table 6.

TABLE 6

| Presensitized plate | Polymerization initiator | Suitability for press development | Plate wear |
|---|---|---|---|
| Example 19 | (101) | 60 sheets | 16,000 sheets |
| Comp. Ex. 10 | (X3) | 300 sheets | 2,000 sheets |

EXAMPLE 20

(Formation of Image-Forming Layer)

The following coating solution was coated on the aluminum support prepared in Example 14 by using a wire bar coater, and dried at 120° C. for 60 seconds to form an image-forming layer in the dry coating amount of 1.0 g/$m^2$. Thus, a presensitized lithographic plate was produced.

| Coating solution for image-forming layer | |
|---|---|
| Infrared absorbing agent (5) used in Example 1 | 2 weight parts |
| The polymerization initiator (101) (solubility in water: 40 wt. % or more) | 10 weight parts |
| The following polymerizable compound | 65 weight parts |
| The following binder polymer (weight average molecular weight: 6,500) | 47 weight parts |
| The fluorine-containing surface-active agent used in Example 1 | 6 weight parts |
| Methyl ethyl ketone | 900 weight parts |

(Polymerizable compound)

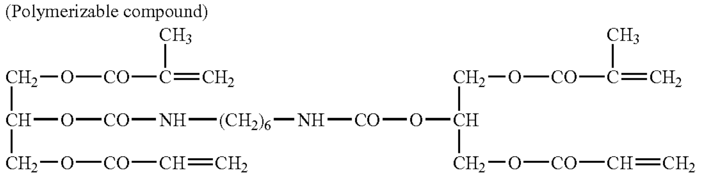

(Binder polymer)

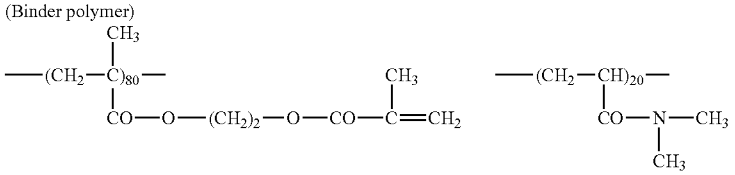

(Process and Evaluation)

The presensitized lithographic plate was evaluated in the same manner as in Example 1. The results are set forth in Table 7.

COMPARISON EXAMPLE 11

The procedures of Example 20 were repeated except that the polymerization initiator (X3) was used in place of the polymerization initiator (101) to produce a presensitized lithographic printing plate. The produced plate was evaluated in the same manner as in Example 1. The results are set forth in Table 7.

TABLE 7

| Presensitized plate | Polymerization initiator | Suitability for press development | Plate wear |
|---|---|---|---|
| Example 20 | (101) | 45 sheets | 13,000 sheets |
| Comp. Ex. 11 | (X3) | 80 sheets | 2,000 sheets |

EXAMPLE 21

(Formation of Image-Forming Layer)

The following coating solution was coated on the aluminum support prepared in Example 14 by using a wire bar coater, and dried at 120° C. for 60 seconds to form an image-forming layer in the dry coating amount of 1.0 g/$m^2$. Thus, a presensitized lithographic plate was produced.

| Coating solution for image-forming layer | |
|---|---|
| Infrared absorbing agent (5) used in Example 1 | 2 weight parts |
| The polymerization initiator (101) (solubility in water: 40 wt. % or more) | 10 weight parts |
| The following polymerizable compound | 65 weight parts |
| The following binder polymer (weight average moleclar weight: 11,000) | 47 weight parts |
| The fluorine-containing surface-active agent used in Example 1 | 6 weight parts |

-continued

| Coating solution for image-forming layer | |
|---|---|
| Methyl ethyl ketone | 900 weight parts |

(Polymerizable compound)

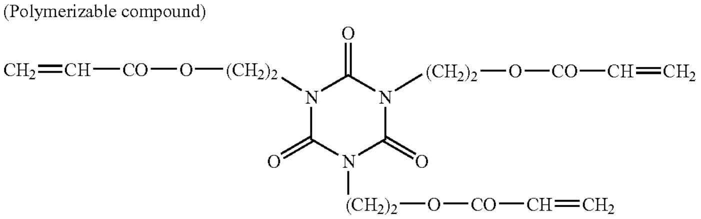

(Binder polymer)

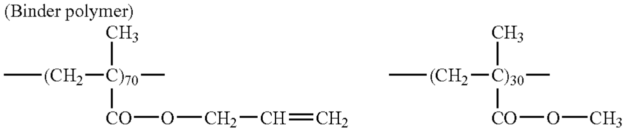

(Process and Evaluation)

The presensitized lithographic plate was evaluated in the same manner as in Example 1. The results are set forth in Table 8.

COMPARISON EXAMPLE 12

The procedures of Example 21 were repeated except that the polymerization initiator (X3) was used in place of the polymerization initiator (101) to produce a presensitized lithographic printing plate. The produced plate was evaluated in the same manner as in Example 1. The results are set forth in Table 8.

TABLE 8

| Presensitized plate | Polymerization initiator | Suitability for press development | Plate wear |
|---|---|---|---|
| Example 21 | (101) | 50 sheets | 16,000 sheets |
| Comp. Ex. 12 | (X3) | 60 sheets | 3,000 sheets |

EXAMPLE 22

(Preparation of Microcapsule Dispersion)

In 17.7 weight parts of ethyl acetate, 6 weight parts of an adduct of 1 mole of trimethylolpropane with 3 mole of xylylene diisocianate (Takenate D-110N, Mistui-Takeda Chemicals, Inc.) containing 25 wt. % ethyl acetate, 7.5 weight parts of dipentaerythritol pentaacrylate (SR-399E, Nihon Kayaku Co., Ltd.), 1.5 weight part of the infrared absorbing agent (6) and 0.1 weight part of a surface-active agent (Pionine A-41C, Takemoto oil & fat Co., Ltd.) were dissolved to prepare an oil phase.

Independently, 37.5 weight parts of 4 wt. % aqueous solution of polyvinyl alcohol (PVA-205, Kuraray Co., Ltd.) was prepared as an aqueous phase.

The oil and aqueous phases were mixed and emulsified with a homogenizer at 12,000 rpm for 10 minutes. To the obtained emulsion, 2.45 weight parts of distilled water was added. The mixture was stirred at room temperature for 30 minutes, and further stirred at 40° C. for 3 hours to prepare microcapsule dispersion. The microcapsule dispersion was diluted with distilled water to adjust the solid content of 20.0 wt. %. The average particle size of the microcapsules was 0.36 μm.

(Formation of Image-Forming Layer)

The following coating solution was coated on the aluminum support prepared in Example 14, and dried at 70° C. for 90 seconds in an oven to form an image-forming layer in the dry coating amount of 1.0 g/$m^2$. Thus, a presensitized lithographic plate was produced.

| Coating solution for image-forming layer | |
|---|---|
| Water | 100 weight parts |
| The microcapsule dispersion (solid content) | 45 weight parts |
| The polymerization initiator (101) | 1 weight part |
| A fluorine-containing surface-active agent (Megaface F-171, Dainippon Ink Chemicals, Ltd.) | 0.1 weight part |

(Process and Evaluation)

The presensitized lithographic plate was evaluated in the same manner as in Example 1. The results are set forth in Table 9.

COMPARISON EXAMPLE 13

The procedures of Example 22 were repeated except that the polymerization initiator (X3) was used in place of the polymerization initiator (101) to produce a presensitized lithographic printing plate. The produced plate was evaluated in the same manner as in Example 1. The results are set forth in Table 9.

TABLE 9

| Presensitized plate | Polymerization initiator | Suitability for press development | Plate wear |
|---|---|---|---|
| Example 22 | (101) | 25 sheets | 4,000 sheets |
| Comp. Ex. 13 | (X3) | 50 sheets | 500 sheets |

EXAMPLES 23-29

The procedures of Example 17 were repeated except that the polymerization initiators (114), (129), (132), (138), (145), (150), (164) were used in place of the polymerization initiator (101) to produce presensitized lithographic printing plates. The produced plate was evaluated in the same manner as in Example 1. The results are set forth in Table 10.

(Polymerization Initiator (114))

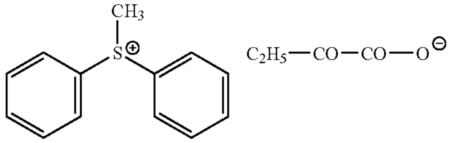

(Polymerization Initiator (129))

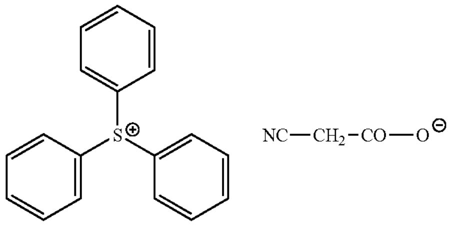

(Polymerization Initiator (132))

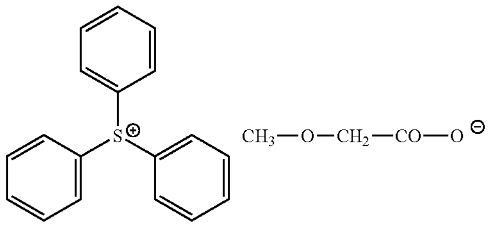

(Polymerization Initiator (138))

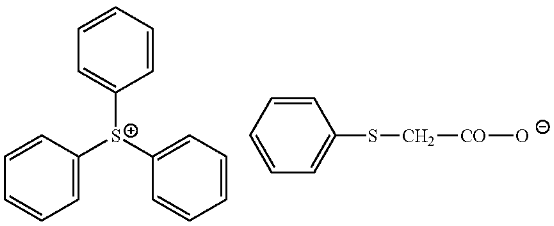

(Polymerization Initiator (145))

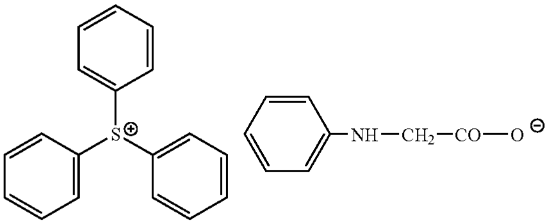

(Polymerization Initiator (150))

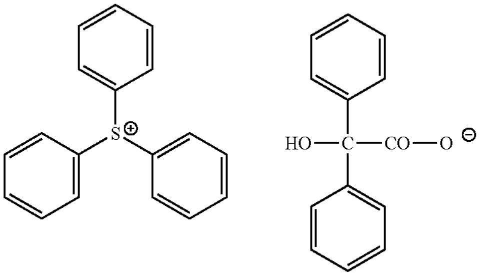

(Polymerization Initiator (164))

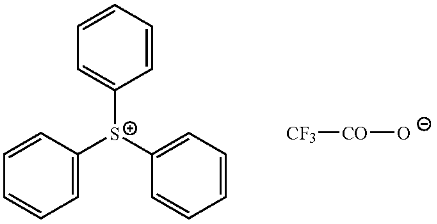

TABLE 10

| Presensitized plate | Polymerization initiator | Suitability for press development | Plate wear |
|---|---|---|---|
| Example 23 | (114) | 90 sheets | 4,000 sheets |
| Example 24 | (129) | 75 sheets | 5,000 sheets |
| Example 25 | (132) | 65 sheets | 6,000 sheets |
| Example 26 | (138) | 70 sheets | 9,000 sheets |
| Example 27 | (145) | 70 sheets | 8,000 sheets |
| Example 28 | (150) | 90 sheets | 7,000 sheets |
| Example 29 | (164) | 65 sheets | 9,000 sheets |

EXAMPLES 30-36

The procedures of Example 22 were repeated except that the polymerization initiators (114), (129), (132), (138), (145), (150), (164) were used in place of the polymerization initiator (101) to produce presensitized lithographic printing plates. The produced plate was evaluated in the same manner as in Example 1. The results are set forth in Table 11.

TABLE 11

| Presensitized plate | Polymerization initiator | Suitability for press development | Plate wear |
|---|---|---|---|
| Example 30 | (114) | 55 sheets | 5,000 sheets |
| Example 31 | (129) | 75 sheets | 5,000 sheets |
| Example 32 | (132) | 75 sheets | 5,000 sheets |
| Example 33 | (138) | 70 sheets | 8,000 sheets |
| Example 34 | (145) | 60 sheets | 6,000 sheets |
| Example 35 | (150) | 70 sheets | 5,000 sheets |
| Example 36 | (164) | 60 sheets | 7,000 sheets |

EXAMPLE 37

(Formation of Image-Forming Layer)

The following coating solution was coated on the aluminum support prepared in Example 1 by using a bar coater, and dried at 70° C. for 60 seconds in an oven to form an image-forming layer in the dry coating amount of 0.8 g/m$^2$. Thus, a presensitized lithographic plate was produced.

| Coating solution for image-forming layer | |
|---|---|
| Water | 100 g |
| The microcapsule dispersion prepared in Example 1 (solid content) | 5 g |
| The polymerization initiator (201) | 0.5 g |
| The fluorine-containing surface-active agent used in Example 1 | 0.2 g |

(Polymerization initiator (201))

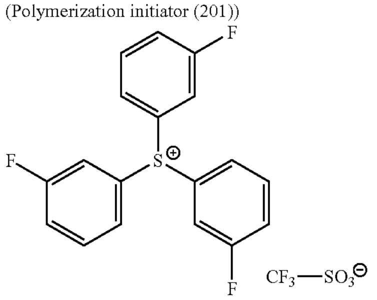

Hammett's substitution constant: 1.02

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 17 W, the outer drum rotation was 133 rpm, and the resolution was 2,400 dpi. The exposed image contains fine-line chart.

The processed lithographic plate was evaluated in the same manner as in Example 1. The results are set forth in Table 12.

EXAMPLE 38

The procedure of Example 37 was repeated except that the polymerization initiator (209) was used in place of the polymerization initiator (201) to produce a presensitized lithographic printing plate. The produced plate was evaluated in the same manner as in Example 1. The results are set forth in Table 12.

(Polymerization Initiator (209))

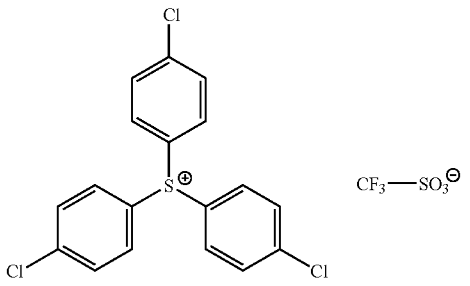

Hammett's substitution constant: 0.69

EXAMPLE 39

The procedure of Example 37 was repeated except that the polymerization initiator (213) was used in place of the polymerization initiator (201) to produce a presensitized lithographic printing plate. The produced plate was evaluated in the same manner as in Example 1. The results are set forth in Table 12.

(Polymerization Initiator (213))

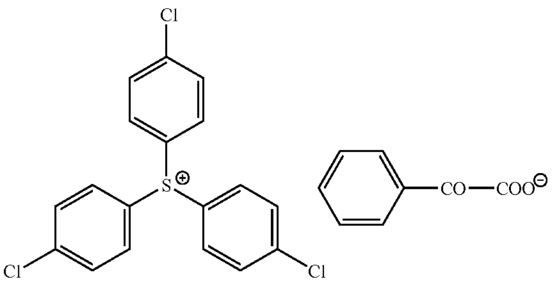

Hammett's substitution constant: 0.69

EXAMPLE 40

The procedure of Example 37 was repeated except that the polymerization initiator (290) was used in place of the polymerization initiator (201) to produce a presensitized lithographic printing plate. The produced plate was evaluated in the same manner as in Example 1. The results are set forth in Table 12.

(Polymerization Initiator (290))

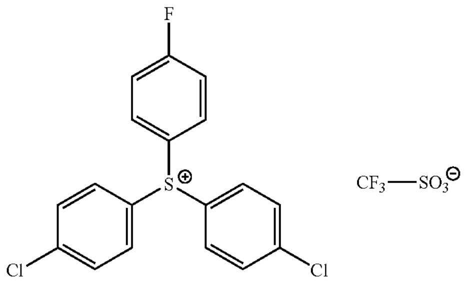

Hammett's substitution constant: 0.52

COMPARISON EXAMPLE 14

The procedure of Example 37 was repeated except that the polymerization initiator (X4) was used in place of the polymerization initiator (201) to produce a presensitized lithographic printing plate. The produced plate was evaluated in the same manner as in Example 1. The results are set forth in Table 12.

(Polymerization Initiator (X4))

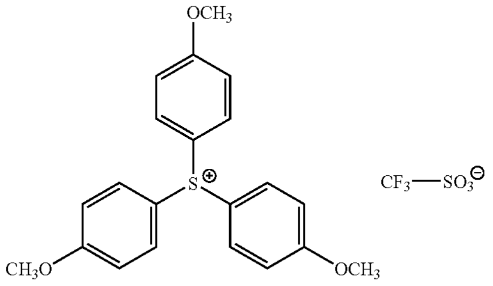

Hammett's substitution constant: −0.81

COMPARISON EXAMPLE 15

The procedure of Example 37 was repeated except that the polymerization initiator (X5) was used in place of the polymerization initiator (201) to produce a presensitized lithographic printing plate. The produced plate was evaluated in the same manner as in Example 1. The results are set forth in Table 12.

(Polymerization Initiator (X5))

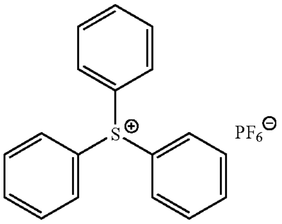

Hammett's substitution constant: 0

TABLE 12

| Presensitized plate | Polymerization initiator | Suitability for on press development | Fine-line repro-ducibility | Plate wear |
|---|---|---|---|---|
| Example 37 | (201) | 20 sheets | 20 μm | 4,800 sheets |
| Example 38 | (209) | 20 sheets | 20 μm | 4,500 sheets |
| Example 39 | (213) | 20 sheets | 20 μm | 4,700 sheets |
| Example 40 | (290) | 20 sheets | 20 μm | 4,600 sheets |
| Comp. Ex. 14 | (X5) | 20 sheets | 30 μm | 1,000 sheets |
| Comp. Ex. 15 | (X6) | 20 sheets | 30 μm | 1,200 sheets |

EXAMPLE 41

(Formation of Image-Forming Layer)

The following coating solution was coated on the aluminum support prepared in Example 1 by using a bar coater, and dried at 100° C. for 60 seconds in an oven to form an image-forming layer in the dry coating amount of 1.0 g/$m^2$. Thus, a presensitized lithographic plate was produced.

| Coating solution for image-forming layer | |
|---|---|
| Infrared absorbing agent (3) | 0.05 g |
| Polymerization initiator (204) | 0.2 g |
| The binder polymer used in Example 4 | 0.5 g |
| Triacrylate denatured with ethylene oxide isocyanulate (NK Ester M-315, Shin Nakamura Chemical Industries, Ltd.) | 1.0 g |
| The fluorine-containing surface-active agent used in Example 1 | 0.1 g |
| Methyl ethyl ketone | 18.0 g |

(Polymerization initiator (204))

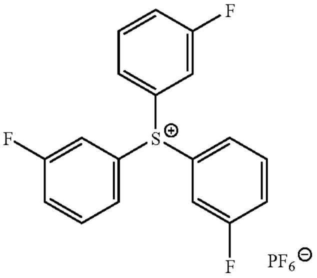

Hammett's substitution constant: 1.02

(Process and Evaluation)

The above-produced presensitized lithographic plate was imagewise exposed by means of an image exposing machine (Trendsetter 3244VX, from Creo) equipped with a water-cooling semiconductor infrared laser of 40 W. The exposing conditions were so adjusted that output was 9 W, the outer drum rotation was 210 rpm, and the resolution was 2,400 dpi. The exposed image contains fine-line chart.

The processed lithographic plate was evaluated in the same manner as in Example 1. The results are set forth in Table 13.

EXAMPLE 42

The procedure of Example 41 was repeated except that the polymerization initiator (209) was used in place of the polymerization initiator (204) to produce a presensitized lithographic printing plate. The produced plate was evaluated in the same manner as in Example 1. The results are set forth in Table 13.

EXAMPLE 43

The procedure of Example 41 was repeated except that the polymerization initiator (244) was used in place of the polymerization initiator (204) to produce a presensitized lithographic printing plate. The produced plate was evaluated in the same manner as in Example 1. The results are set forth in Table 13.

(Polymerization Initiator (244))

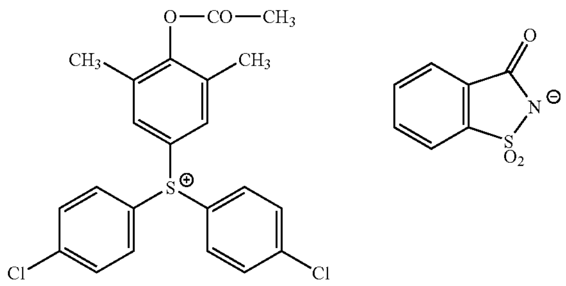

Hammett's substitution constant: 0.63

EXAMPLE 44

The procedure of Example 41 was repeated except that the polymerization initiator (252) was used in place of the polymerization initiator (204) to produce a presensitized lithographic printing plate. The produced plate was evaluated in the same manner as in Example 1. The results are set forth in Table 13.

(Polymerization Initiator (252))

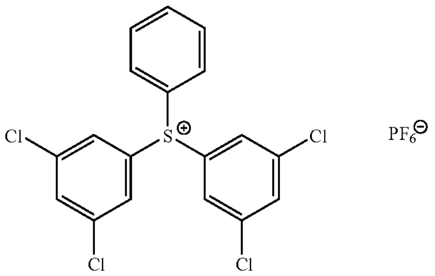

Hammett's substitution constant: 1.48

EXAMPLE 45

The procedure of Example 41 was repeated except that the polymerization initiator (291) was used in place of the polymerization initiator (204) to produce a presensitized lithographic printing plate. The produced plate was evaluated in the same manner as in Example 1. The results are set forth in Table 13.

(Polymerization Initiator (291))

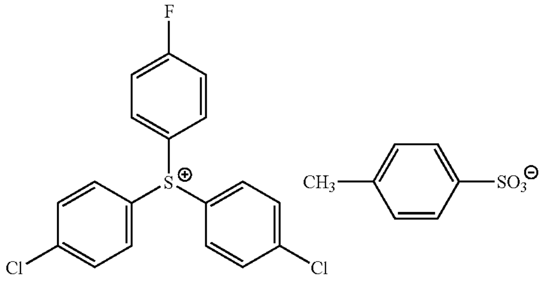

Hammett's substitution constant: 0.52

EXAMPLE 46

The procedure of Example 41 was repeated except that the polymerization initiator (292) was used in place of the polymerization initiator (204) to produce a presensitized lithographic printing plate. The produced plate was evaluated in the same manner as in Example 1. The results are set forth in Table 13.

(Polymerization Initiator (292))

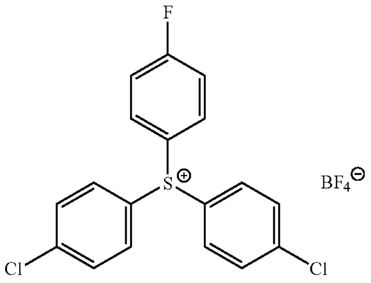

Hammett's substitution constant: 0.52

EXAMPLE 47

The procedure of Example 41 was repeated except that the homopolymer of the repeating units IV-1•C101 was used in place of the polymerization initiator (204) to produce a presensitized lithographic printing plate. The produced plate was evaluated in the same manner as in Example 1. The results are set forth in Table 13.

(Repeating Units IV-1•C101)

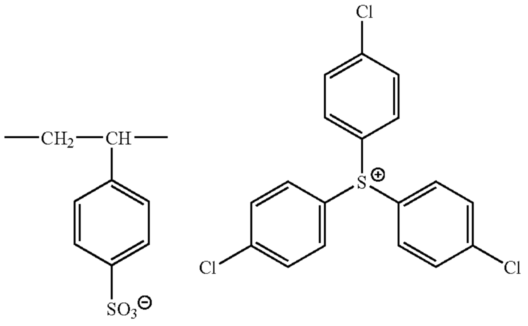

COMPARISON EXAMPLE 16

The procedure of Example 41 was repeated except that the polymerization initiator (X4) was used in place of the polymerization initiator (204) to produce a presensitized lithographic printing plate. The produced plate was evaluated in the same manner as in Example 1. The results are set forth in Table 13.

COMPARISON EXAMPLE 17

The procedure of Example 41 was repeated except that the polymerization initiator (X5) was used in place of the polymerization initiator (204) to produce a presensitized lithographic printing plate. The produced plate was evaluated in the same manner as in Example 1. The results are set forth in Table 13.

TABLE 13

| Presensitized plate | Polymerization initiator | Suitability for on press development | Fine-line reproducibility | Plate wear |
|---|---|---|---|---|
| Example 41 | (204) | 40 sheets | 30 μm | 5,500 sheets |
| Example 42 | (209) | 40 sheets | 20 μm | 5,500 sheets |
| Example 43 | (244) | 45 sheets | 30 μm | 4,500 sheets |
| Example 44 | (252) | 40 sheets | 20 μm | 5,000 sheets |
| Example 45 | (291) | 40 sheets | 30 μm | 4,500 sheets |
| Example 46 | (292) | 40 sheets | 30 μm | 4,500 sheets |
| Example 47 | IV-1 · C101 | 43 sheets | 20 μm | 5,000 sheets |
| Comp. Ex. 16 | (X4) | 47 sheets | 50 μm | 1,500 sheets |
| Comp. Ex. 17 | (X5) | 40 sheets | 50 μm | 2,000 sheets |

The invention claimed is:

1. A lithographic printing process which comprises the steps of:

imagewise exposing to infrared light a presensitized lithographic plate which comprises a hydrophilic support and an image-forming layer containing an infrared absorbing agent, a radical polymerization initiator, an ethylenically unsaturated polymerizable compound and a binder polymer, said polymerization initiator being a salt of a sulfonium ion with an anion selected from the group consisting of (1) hydrogensulfate ion, (2) a sulfate ester ion, (3) a polymer having a carboxylate ion, (4) a polymer having a sulfonate ion, (5) a polymer having an anion of $—S0_2—N^-—R^1$ (wherein $R^1$ is carboxyl, formyl, an aliphatic group, an aromatic group, a heterocyclic group, —O—R, —S—R, —CO—R, —O—CO—R or —CO—O—R, and wherein R is an aliphatic group, an aromatic group or a heterocyclic group), (6) a carboxylate ion having an α-carbon atom substituted with an acyl group, carbamoyl, a substituted carbamoyl group or cyano, (7) a carboxylate ion having an α-carbon atom substituted with two or more aromatic groups, and (8) a carboxylate ion having an α-carbon atom to which a non-metallic atom other than carbon and hydrogen is attached, to cause a radical polymerization reaction of the polymerizable compound within the exposed area;

removing the image-forming layer within the unexposed area while mounting the lithographic plate on a cylinder of a printing press; and then printing an image with the lithographic plate while mounting the lithographic plate on the cylinder of the printing press.

2. The lithographic printing process as defined in claim 1, wherein the sulfonate ion comprises a sulfur atom to which three aliphatic, aromatic or heterocyclic groups are attached.

3. The lithographic printing process as defined in claim 2, wherein the sulfonate ion comprises a sulfur atom to which three aromatic groups are attached.

4. The lithographic printing process as defined in claim 1, wherein the polymerization initiator is a salt of a sulfonium ion with a sulfate ester ion represented by the formula (I):

$$R—O—SO_3— \quad (I)$$

in which R is an aliphatic group, an aromatic group or a heterocyclic group.

5. The lithographic printing process as defined in claim 1, wherein the polymerization initiator is a polymer comprising repeating units represented by the formula (II)

(II)

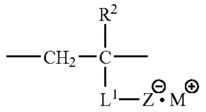

in which $R^2$ is hydrogen, a halogen atom, hydroxyl, carboxyl, formyl, amino, carbamoyl, ureido, sulfo, sulfamoyl, an aliphatic group, an aromatic group, a heterocyclic group, —O—R, —S—R, —CO—R, —O—CO—R, —CO—O—R, —NH—R, —NH—CO—R, —CO—NH—R, —NH—CO—NH—R, —NH—CO—O—R, —O—CO—NH—R, $—SO_2—R$, $—NH—SO_2—R$ or $—SO_2—NH—R$, wherein R is an aliphatic group, an aromatic group or a heterocyclic group; $L^1$ is a single bond or a divalent linking group; X is —COO—, $—SO_3—$ or $—SO_2—N^-—R1$, wherein $R^1$ is carboxyl, formyl, a aliphatic group, an aromatic group, a heterocyclic group, —O—R, —S—R, —CO—R, 0-CO—R or —CO—O—R, and wherein R is an aliphatic group, an aromatic group or a heterocyclic group; and M is a sulfonium ion.

6. The lithographic printing process as defined in claim 1, wherein the image-forming layer contains the polymerization initiator in an amount of 0.1 to 50 wt. % based on the total solid content of the image-forming layer.

7. The lithographic printing process as defined in claim 1, wherein the polymerizable compound is contained in microcapsules, which are dispersed in the image-forming layer, and the binder polymer is arranged outside the microcapsules.

8. The lithographic printing process as defined an claim 1, wherein the presensitized lithographic plate is imagewise exposing to infrared light by scanning the plate with an infrared laser beam.

9. The lithographic printing process as defined in claim 1, wherein the presensitized lithographic plate is imagewise exposing to infrared light while mounting the lithographic plate on the cylinder of the printing press.

10. A presensitized lithographic plate which comprises a hydrophilic support and an image-forming layer containing an infrared absorbing agent, a radical polymerization initiator, an ethylenically unsaturated polymerizable compound and a binder polymer, said polymerization initiator being a salt of a sulfonium ion with an anion selected from the group consisting of (1) hydrogensulfate ion, (2) a sulfate ester ion, (3) a polymer having a carboxylate ion, (4) a polymer having a sulfonate ion, and (5) a polymer having an anion of $—SO^2—N^-—R^1$ (wherein $R^1$ is carboxyl, formyl, an aliphatic group, an aromatic group, a heterocyclic group, —O—R, —S—R, —CO—R, —O—CO—R or —CO—O—R, and wherein R is an aliphatic group, an aromatic group or a heterocyclic group), wherein the polymerizable compound is contained in microcapsules, which are dispersed in the image-forming layer, and the binder polymer is arranged outside the microcapsules.

11. A lithographic printing process which comprises the steps of:

imagewise exposing to infrared light a presensitized lithographic plate which comprises a hydrophilic support and an image-forming layer containing an infrared absorbing agent, a radical polymerization initiator, an ethylenically unsaturated polymerizable compound and a binder polymer, said polymerization initiator being a salt of an anion with a sulfonium ion which comprises a sulfur atom to which three aromatic groups are attached, at least one of the aromatic groups being substituted with one electron attractive group, which has Hammett's substitution constant of more than 0.46 or substituted with two or more electron attractive groups which have Hammett's substitution constant of more than 0.46 in total, to cause a radical polymerization reaction of the polymerizable compound within the exposed area;

removing the image-forming layer within the unexposed area while mounting the lithographic plate while mounting the lithographic plate while on a cylinder of a printing press; and then printing an image with the lithographic plate while mounting the lithographic plate on the cylinder of the printing press.

12. The lithographic printing process as defined in claim 11, wherein the anion is a sulfonate ion, a sulfonate ion, a carboxylate ion, a borate ion, a halide ion, sulfate ion, hydrogensulfate ion, hexafluorophosphate ion, tetrafluoroborate ion or perchlorate ion.

13. The lithographic printing process as defined in claim 11, wherein the sulfonium ion has one electron attractive group which has Hammett's substitution constant of more than 0.46.

14. The lithographic printing process as defined in claim 11, wherein the sulfonium ion has two or more electron attractive groups which have Hammett's substitution constant of more than 0.46 in total.

15. The lithographic printing process as defined in claim 11, wherein the image-forming layer contains the polymerization initiator in an amount of 0.1 to 50 wt. % based on the total solid content of the image-forming layer.

16. The lithographic printing process as defined in claim 11, wherein the polymerizable compound is contained in microcapsules, which are dispersed in the image forming layer, and the binder polymer is arranged outside the microcapsules.

17. The lithographic printing process as defined in claim 11, wherein the presensitized lithographic plate is imagewise exposing to infrared light by scanning the plate with an infrared laser beam.

18. The lithographic printing process as defined in claim 11, wherein the presensitized lithographic plate is imagewise exposing to infrared light while mounting the lithographic plate on the cylinder of the printing press.

19. A presensitized lithographic plate which comprises a hydrophilic support and an image-forming layer containing an infrared absorbing agent, a radical polymerization initiator, an ethylincially unsaturated polymerizable compound and a binder polymer, said polymerization initiator being a salt of an anion with a sulfonium ion which comprises a sulfur atom to which three aromatic groups are attached, at least one of the aromatic groups being substituted with an electron attractive group, wherein the polymerizable compound is contained in microcapsules, which are dispersed in the image-forming layer, and the binder polymer is arranged outside the microcapsules.

20. The lithographic printing process as defined in claim 1, wherein the sulfonium ion comprises at least one electron attractive group which has Hammett's substitution constant of more than 0.46, or two or more electron attractive groups which have Hammett's substitution constant of more than 0.46 in total.

* * * * *